United States Patent [19]
Yamamoto et al.

[11] Patent Number: 5,729,030
[45] Date of Patent: Mar. 17, 1998

[54] SEMICONDUCTOR DEVICE

[75] Inventors: Yoshitsugu Yamamoto; Norio Hayafuji, both of Tokyo, Japan

[73] Assignee: Mitsubishi Denki Kabushiki Kaisha, Tokyo, Japan

[21] Appl. No.: 653,245

[22] Filed: May 24, 1996

[30] Foreign Application Priority Data

Nov. 6, 1995 [JP] Japan .................................. 7-287273

[51] Int. Cl.$^6$ ...................................... H01L 33/00
[52] U.S. Cl. .................................. 257/103; 257/94
[58] Field of Search ........................ 257/103, 94

[56] References Cited

FOREIGN PATENT DOCUMENTS

| | | |
|---|---|---|
| 0531550 | 3/1993 | European Pat. Off. . |
| 0747965 | 12/1996 | European Pat. Off. . |
| 2239016 | 7/1994 | France . |
| 56-026484 | 3/1981 | Japan . |
| 57-026492 | 2/1982 | Japan . |
| 58-053863 | 3/1983 | Japan . |
| 61-156773 | 7/1986 | Japan . |
| 02005438 | 1/1990 | Japan . |
| 03088340 | 4/1991 | Japan . |
| 388340 | 4/1991 | Japan . |

OTHER PUBLICATIONS

Hayafuji et al., "Thermal Stability Of AlInAs/GaInAs/InP Hetero-structures", Applied Physics Letters, vol. 66, No. 7, 1995, pp. 863–865.

Miya et al., "AlGaAsSb Buffer/Barrier Layer On GaAs Substrate For InAs Channel With High Electron Properties", Proceedings of the 7th Annual Conference on Indium Phosphide and Related Materials, 1995, pp. 440–443.

*Primary Examiner*—Stephen Meier
*Attorney, Agent, or Firm*—Leydig, Voit & Mayer, LTD.

[57] ABSTRACT

A semiconductor device includes an InP substrate; a channel layer in which electrons, as charge carriers, travel; and an $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) electron supply layer for supplying electrons to the channel layer. The electron supply layer has an electron affinity smaller than that of the channel layer and is doped with a dopant impurity producing n type conductivity. Since n type AlGaAsPSb is thermally stable, its electrical characteristics are not changed by heat treatment at about 350° C., resulting in a thermally stable and highly reliable HEMT in which the characteristics hardly change with the passage of time during fabrication and operation. Further, a heterostructure including an electron supply layer and a channel layer and having a desired energy band structure is easily produced with a wide degree of freedom in designing the device.

15 Claims, 19 Drawing Sheets y in $Al_xGa_{1-x}As_{1-y}Sb_y$ y in $Al_xGa_{1-x}As_{1-y}Sb_y$

+ : ionized donor
⊖ : carrier (electron)

SEMICONDUCTOR DEVICE

FIELD OF THE INVENTION

The present invention relates to semiconductor devices and, more particularly, to compound semiconductor devices employing AlGaAsPSb.

BACKGROUND OF THE INVENTION

In recent years, $Al_{0.48}In_{0.52}As$ (hereinafter referred to simply as AlInAs) has been of great interest as a compound semiconductor that lattice-matches with an InP substrate, and a heterojunction structure comprising AlInAs and $In_xGa_{1-x}As_yP_{1-y}$ ($0 \leq x \leq 1$, $0 \leq y \leq 1$) has been extensively applied for both optical and electronic devices to improve the performance of the devices. However, the thermal stability of n type AlInAs has not been well established up to now. Therefore, it is difficult to realize a highly reliable device using n type AlInAs.

FIG. 28 is a cross-sectional view illustrating a prior art AlInAs/InGaAs high electron mobility transistor (hereinafter referred to as an HEMT). In the figure, reference numeral 1 designates a semi-insulating InP substrate. A low resistance undoped AlInAs buffer layer 2 is disposed on the substrate 1. An undoped InGaAs channel layer 3 having a very low impurity concentration is disposed on the buffer layer 2. An undoped AlInAs spacer layer 4 having a very low impurity concentration is disposed on the channel layer 3. An n type AlInAs electron supply layer 5 having an electron affinity smaller than that of the InGaAs channel layer 3 and a high concentration of a dopant impurity producing n type conductivity, such as Si, is disposed on the spacer layer 4. An undoped AlInAs Schottky layer 6 having a very low impurity concentration is disposed on the electron supply layer 5. A gate electrode 8 that controls current flowing in the channel layer 3 is disposed on a portion of the Schottky layer 6. The Schottky layer 6 makes a Schottky contact with the gate electrode 8. N type InGaAs contact layers 7 having a high concentration of a dopant impurity producing n type conductivity are disposed on the Schottky layer 6 at both sides of and spaced apart from the gate electrode 8. Spaced apart source and drain electrodes 9 and 10 are disposed on the respective contact layers 7. The contact layers 7 make ohmic contact with the source and drain electrodes 9 and 10.

Since the gate electrode 8 is disposed on the surface of the undoped AlInAs Schottky layer 6 having a very low impurity concentration, the contact of the gate electrode 8 with the Schottky layer 6 is a satisfactory Schottky contact. In addition, since the source and drain electrodes 9 and 10 are disposed on the surface of the highly-doped n type InGaAs contact layers 7, the contact of the source and drain electrodes with the contact layers is a satisfactory ohmic contact. Further, the buffer layer 2 prevents leakage current at the interface between the substrate and the grown semiconductor layers.

FIG. 29 is an energy band diagram of the AlInAs/InGaAs HEMT structure shown in FIG. 28. As shown in FIG. 29, since the electron affinity of the InGaAs channel layer 3 is larger than the electron affinity of the AlInAs electron supply layer 5, electrons supplied from the ionized donors in the n type AlInAs electron supply layer 5 travel toward the InGaAs channel layer 3 and produce a two-dimensional electron gas (hereinafter referred to as 2-DEG) in a region of the channel layer 3 in the vicinity of the boundary between the channel layer 3 and the electron supply layer 5. Since these electrons travel through the very low impurity concentration InGaAs layer, when the drain electrode 10 has a positive potential with respect to the source electrode 9, electrons in the channel layer 3 move from the source toward the drain at a very high speed, whereby current flows between the source to the drain. The concentration of the 2-DEG is controlled by changing the voltage of the gate electrode 8, whereby the current flowing between the source and the drain is controlled. In addition, the spacer layer 4 prevents impurities in the electron supply layer 5 from diffusing into the channel layer 3, whereby unwanted reduction in the electron mobility in the channel layer 3 is avoided.

In the prior art AlInAs/InGaAs HEMT, although n type AlInAs is employed as a material of the electron supply layer 5, the resistance of n type AlInAs to heat is very low. For example, when it is subjected to a heat treatment at 300° C., the carrier concentration decreases to 90% of the carrier concentration before the heat treatment. Further, the carrier concentration significantly decreases to 30% by a heat treatment at 450° C. Therefore, when the prior art HEMT is subjected to a heat treatment at 300°~450° C., such as sintering for making the ohmic contact, resist baking in photolithography, or die-bonding in assembly, the carrier concentration of the n type AlInAs electron supply layer significantly decreases. As a result, the operating characteristics of the HEMT are degraded. Further, the operating characteristics change with the passage of time.

Meanwhile, the thermal stability of AlInAs/InGaAs/InP HEMT structures is reported in Applied Physics Letters, Vol. 66, No. 7, 1995, pp. 863~865. According to this report, the carrier concentration of the n type AlInAs electron supply layer significantly decreases for an annealing temperature exceeding 350° C., and the electrical characteristics of the HEMT are degraded. This is attributed to the fact that fluorine diffuses during the annealing and inactivates donors in the n type AlInAs electron supply layer. This phenomenon is peculiar to n type AlInAs. Therefore, in semiconductor devices employing n type AlInAs, the electrical characteristics are unfavorably varied by heat. That is, when n type AlInAs is employed for a semiconductor device, the electrical characteristics are unfavorably varied due to heat treatment in a wafer stage process, so that desired characteristics cannot be obtained. Further, the thermal stability and the reliability of the semiconductor device are degraded.

Furthermore, when $Al_xIn_{1-x}As$ is lattice-matched with an InP substrate, the Al composition x is fixed at 0.48 unconditionally and the band structure is also fixed unconditionally. Therefore, when a semiconductor device having a heterojunction structure at an interface between AlInAs that is lattice-matched with InP and another material is designed, the degree of freedom in the design is small, whereby a restriction is placed on improvement of the performance of the semiconductor device.

SUMMARY OF THE INVENTION

It is an object of the present invention to provide a semiconductor device fabricated on an InP substrate, having thermal stability and high reliability, and providing a high degree of freedom in design.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a semiconductor device includes a semiconductor substrate, and an $Al_xGa_{1-x}As_yP_zSb_{1-y-z}$ ($0 \leq x \leq 1$, $0 \leq y<1$, $0<z \leq 1$) layer disposed on the semiconductor substrate. In the $Al_xGa_{1-x}As_yP_zSb_{1-y-z}$ layer, by varying the compositions x, y, and z, the energy band gap Eg of this layer can be varied in a wide range while lattice-matching with the semiconductor substrate. In addition, by varying the compositions x, y, and z with maintaining an appropriate relationship between x and y or x and z, the band discontinuity at the heterointerface between the energy Ec at the lower end of the conduction band and the energy Ev at the upper end of the valence band can be varied without changing the energy band gap Eg. Therefore, a heterostructure having a desired energy band structure is easily produced with a high degree of freedom, whereby the degree of freedom in designing the device is significantly increased.

According to a second aspect of the present invention, a semiconductor device includes an InP substrate having a lattice constant; a channel layer disposed at a position above the InP substrate and having an electron affinity, wherein electrons, as charge carriers, travel; and an $Al_{x1}Ga_{1-x1}As_{y1}P_{z1}Sb_{1-y1-z1}$ ($0 \leq x1 \leq 1$, $0 \leq y1<1$, $0<z1 \leq 1$) electron supply layer for supplying electrons to the channel layer, the electron supply layer having an electron affinity smaller than the electron affinity of the channel layer and being doped with an n type producing dopant. Since n type AlGaAsPSb is thermally stable, the electrical characteristics thereof are never changed due to heat treatment at about 350° C. Therefore, a thermally stable and highly reliable HEMT in which the characteristics are hardly changed with the passage of time during the fabrication and the operation is realized. Further, In the $Al_{x1}Ga_{1-x1}As_{y1}P_{z1}Sb_{1-y1-z1}$ electron supply layer, by varying the compositions x1, y1, and z1, the energy band gap Eg of this layer can be varied in a wide range while lattice-matching with the InP substrate. In addition, by varying the compositions x1, y1, and z1 with maintaining an appropriate relationship between x1 and y1 or x1 and z1, the band discontinuity at the heterointerface between the energy Ec at the lower end of the conduction band and the energy Ev at the upper end of the valence band can be varied without changing the energy band gap Eg. Therefore, a heterostructure having a desired energy band structure is easily produced with a high degree of freedom, whereby the degree of freedom in designing the device is significantly increased. Furthermore, since AlGaAsPSb is employed for the electron supply layer, at the heterointerface between the electron supply layer and the channel layer, the difference between the energy band gap Eg of the electron supply layer and the energy discontinuity ΔEc at the lower end of the conduction band, i.e., Eg−ΔEc, is increased as compared to that provided by an AlGaAsSb electron supply layer, whereby recombination of charge carriers at the heterointerface is suppressed. As a result, the carrier concentration of the channel layer is increased, providing a HEMT with improved operating characteristics.

According to a third aspect of the present invention, the semiconductor device further includes an undoped $Al_{x2}Ga_{1-x2}As_{y2}P_{z2}Sb_{1-y2-z2}$ ($0 \leq x2 \leq 1$, $0 \leq y2<1$, $0<z2 \leq 1$) spacer layer disposed at a position between the channel layer and the electron supply layer and having an electron affinity smaller than the electron affinity of the channel layer. The spacer layer prevents impurities in the electron supply layer from diffusing into the channel layer, so that unwanted reduction of the electron mobility in the channel layer due to the impurity diffusion is avoided. Further, since AlGaAsPSb is employed for the spacer layer, the degree of freedom in designing the device is increased as compared to the case where AlInAs is employed for the spacer layer.

According to a fourth aspect of the present invention, the semiconductor device further includes an undoped $Al_{x3}Ga_{1-x3}As_{y3}P_{z3}Sb_{1-y3-z3}$ ($0 \leq x3 \leq 1$, $0 \leq y3<1$, $0<z3 \leq 1$) Schottky layer disposed at a position above the channel layer and the electron supply layer; and a gate electrode disposed on the Schottky layer. Therefore, a satisfactory Schottky contact is made for the contact of the gate electrode with the Schottky layer. Further, since AlGaAsPSb is employed for the Schottky layer, the degree of freedom in designing the device is increased as compared to the case where AlInAs is employed for the spacer layer.

According to a fifth aspect of the present invention, the semiconductor device further includes an undoped $Al_{x4}Ga_{1-x4}As_{y4}P_{z4}Sb_{1-y4-z4}$ ($0 \leq x4 \leq 1$, $0 \leq y4<1$, $0<z4 \leq 1$) buffer layer contacting the InP substrate and being disposed at a position below the channel layer and the electron supply layer. Therefore, leakage current at the interface between the InP substrate and a semiconductor layer grown on the substrate is prevented, resulting in a HEMT with improved electrical characteristics.

According to a sixth aspect of the present invention, in the semiconductor device, the electron supply layer includes a planar region doped with the n type producing dopant. In this structure, since the atomic planar doped region serving as a high concentration electron supply source is disposed in the vicinity of the channel layer, a high concentration 2-DEG is produced in the channel layer, so that the carrier concentration in the channel layer is increased, resulting in a high-performance HEMT.

According to a seventh aspect of the present invention, in the semiconductor device, the electron supply layer includes a quantum well region comprising AlGaAsPSb and doped with the n type producing dopant. In this structure, ionized donors in the quantum well in the quantum well region produce a sub band, so that electrons are supplied to the channel layer with high efficiency as compared with the case where an n type producing dopant is uniformly doped in the electron supply layer. Therefore, the concentration of electrons, as charge carriers, in the channel layer is increased, whereby the electrical characteristics of the HEMT are improved.

According to an eighth aspect of the present invention, in the semiconductor device, the electron supply layer is disposed at a position above the channel layer. Therefore, resistance between source and drain electrodes and the channel layer is reduced, whereby the source resistance and the drain resistance are reduced, resulting in a HEMT with improved electrical characteristics.

According to a ninth aspect of the present invention, in the semiconductor device, the electron supply layer is disposed at a position between the channel layer and the InP substrate. In this structure, only the undoped Schottky layer is present between the channel layer and the gate electrode, and the electron supply layer highly doped with an n type producing dopant is disposed on the substrate side of the channel layer. Therefore, compared with the HEMT in which the electron supply layer is disposed on the gate side of the channel layer, the gate breakdown voltage is increased. In addition, influences of the variation in the surface condition of the semiconductor layer on the device characteristics is suppressed.

According to a tenth aspect of the present invention, the semiconductor device includes two electron supply layers disposed at a position above the channel layer and a position between the channel layer and the InP substrate, respectively. In this structure, since the electron supply layers are disposed on both the gate side and the substrate side of the channel layer, the concentration of the 2-DEG in the channel layer is further increased, resulting in a HEMT suitable for high-power output operation that requires high current driving ability.

According to an eleventh aspect of the present invention, in the semiconductor device, the channel layer is a strained lattice layer comprising a semiconductor material having a lattice constant different from the lattice constant of the InP substrate. More specifically, an undoped $In_xGa_{1-x}As$ ($0.53<x\leq1$) strained lattice channel layer is employed. Therefore, compared with an $In_{0.53}Ga_{0.47}As$ channel layer that lattice-matches with InP, the band discontinuity $\Delta Ec$ between the channel layer and the electron supply layer in the conduction band is increased, whereby a high concentration 1-DEG is produced in the channel layer. In addition, since the In composition in the channel layer is large, the electron mobility and the saturation speed in the channel layer are increased. As a result, the electrical characteristics of the HEMT are improved.

According to a twelfth aspect of the present invention, a semiconductor laser device includes an active layer emitting laser light and having an energy band gap; and an $Al_{x5}Ga_{1-x5}As_{y5}P_{z5}Sb_{1-y5-z5}$ ($0\leq x5\leq1$, $0\leq y5<1$, $0<z5\leq1$) lower cladding layer having a first conductivity type and an energy band gap larger than the energy band gap of the active layer, and an $Al_{x6}Ga_{1-x6}As_{y6}P_{z6}Sb_{1-y6-z6}$ ($0\leq x6\leq1$, $0\leq y6<1$, $0<z6\leq1$) lower cladding layer having a second conductivity type, opposite the first conductivity type, and an energy band gap larger than the energy band gap of the active layer, the lower and upper cladding layers sandwiching the active layer. In this double heterojunction structure comprising the lower cladding layer, the active layer, and the upper cladding layer, the potential barriers of each heterojunction, in other words, the energy band discontinuity $\Delta Ec$ at the lower end of the conduction band and the energy band discontinuity $\Delta Ev$ at the upper end of the valence band, can be varied by varying the compositions of AlGaAsPSb constituting the lower cladding layer and the upper cladding layer, whereby a semiconductor laser having a desired energy band structure is easily fabricated. In addition, since AlGaAsPSb is employed for the cladding layers, a thermally stable and highly reliable semiconductor laser is realized, and the degree of freedom in design is improved.

According to a thirteenth aspect of the present invention, in the semiconductor laser device, the active layer comprises $Al_{x7}Ga_{1-x7}As_{y7}P_{z7}Sb_{1-y7-z7}$ ($0\leq x7\leq1$, $0\leq y7<1$, $0<z7\leq1$). The energy band gap Eg of AlGaAsPSb can be varied by changing the composition while maintaining the lattice constant, i.e., while lattice-matching with InP. Therefore, by appropriately selecting the composition of the AlGaAsPSb active layer, the oscillating wavelength of laser light can be varied in a wide range from 0.6 μm to 2 μm with the active layer being lattice-matched with the InP substrate. When the active layer comprises AlGaAsSb, the energy band discontinuity $\Delta Ec$ in the active layer is decreased, and the electron confining effect is degraded, whereby the laser light emitting efficiency is reduced. In the semiconductor laser with the AlGaAsPSb active layer, however, the energy band discontinuity $\Delta Ec$ can be increased by increasing the P composition. Therefore, unwanted degradation of the electron confining effect in the active layer is avoided, resulting in a semiconductor laser having a high light emitting efficiency. Furthermore, since AlGaAsPSb is employed for the active layer and the upper and lower cladding layers, a thermally stable and highly reliable semiconductor laser is realized, and the degree of freedom in design is improved.

According to a fourteenth aspect of the present invention, in the semiconductor laser device, the active layer comprises InGaAsSb or InGaPSb. Therefore, the oscillating wavelength of laser light can be varied in a wide range from 2 μm to 4 μm with the active layer being lattice-matched with the InP substrate.

DETAILED DESCRIPTION OF THE PREFERRED EMBODIMENTS

[Embodiment 1]

Figure 1:
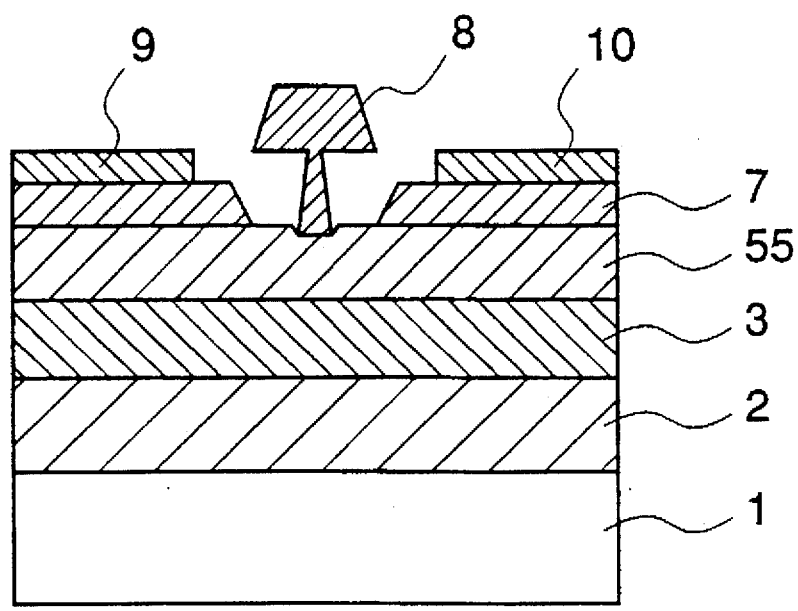
FIG. 1 is a cross-sectional view illustrating an HEMT in accordance with a first embodiment of the present invention.

FIG. 1 is a cross-sectional view illustrating an HEMT employing n type AlGaAsPSb for an electron supply layer in accordance with a first embodiment of the present invention. In the figure, reference numeral 1 designates a semi-insulating InP substrate. A high resistance undoped AlInAs buffer layer 2 having a thickness of 250 nm is disposed on the substrate 1. This buffer layer 2 prevents current from flowing into the substrate 1. An undoped InGaAs channel layer 3 having a very low impurity concentration and a thickness of 50 nm is disposed on the buffer layer 2. A Te-doped n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) electron supply layer 55 is disposed on the channel layer 3. This electron supply layer 55 has an electron affinity smaller than that of the InGaAs channel layer 3, a high dopant impurity concentration of $4 \times 10^{18}$ $cm^{-3}$, and a thickness of 10~30 nm. A T-shaped gate electrode 8 comprising Ti/Pt/Au is disposed on the electron supply layer 55. N type InGaAs contact layers 7 are disposed on the electron supply layer 55 at both sides of and spaced apart from the gate electrode 8. The contact layers 7 have a high dopant impurity concentration of $4 \times 10^{18}$ $cm^{-3}$ producing n type conductivity type and a thickness of 50 nm. Spaced apart source and drain electrodes 9 and 10 are disposed on the respective contact layers 7. Preferably, the source and drain electrodes 9 and 10 comprise AuGe or WSi. Since the source and drain electrodes 9 and 10 are disposed on the n type InGaAs contact layers 7 that are highly doped, a satisfactory ohmic contact is produced between the source and drain electrodes and the contact layers.

A description is given of the operation of the HEMT. The electron supply layer 55 induces a 2-DEG in the channel layer 3 at the boundary between the channel layer and the electron supply layer, whereby charge carriers, i.e., electrons, are supplied to the channel layer 3. When the drain has a positive potential with respect to the source, electrons in the channel layer 3 travel from the source toward the drain, and current flows between the source and the drain. The concentration of the 2-DEG is controlled with the voltage applied to the gate electrode, whereby the current flowing between the source and the drain is controlled.

Figure 2:
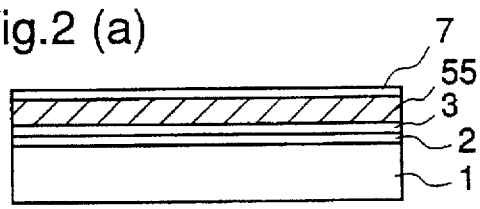
FIGS. 2(a)–2(k) are cross-sectional views illustrating process steps in a method of fabricating the HEMT shown in FIG. 1.
Figure 2:
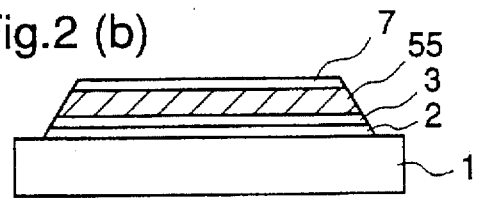
Figure 2:
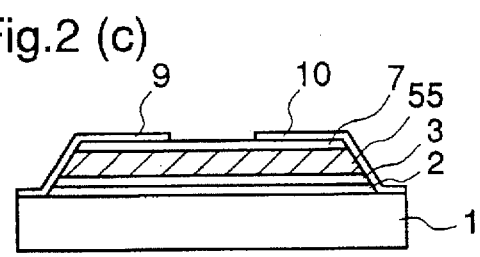
Figure 2:
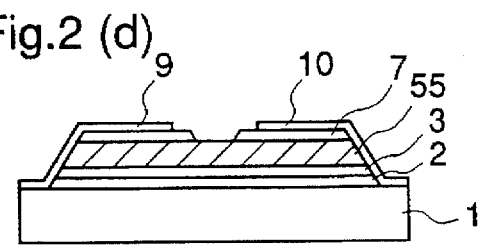
Figure 2:
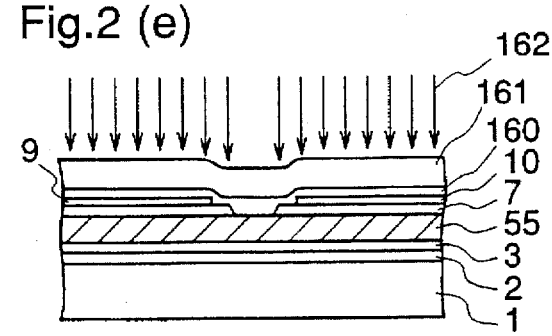
Figure 2:
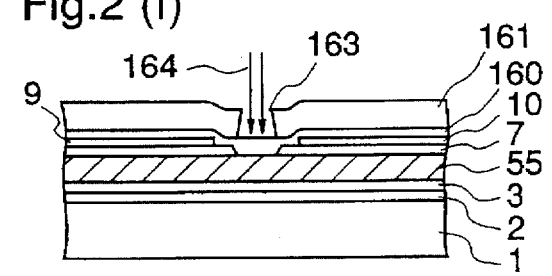
Figure 2:
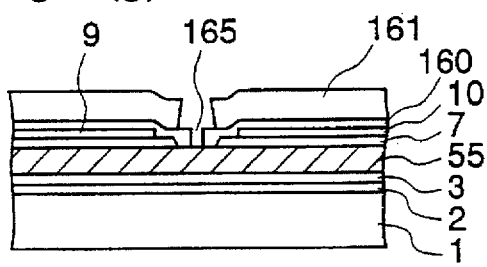
Figure 2:
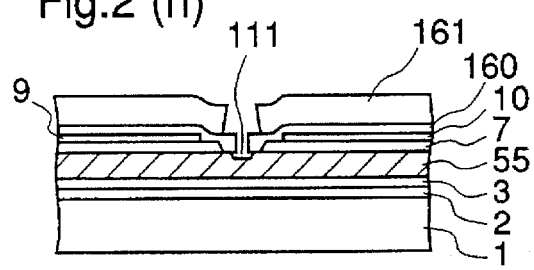
Figure 2:
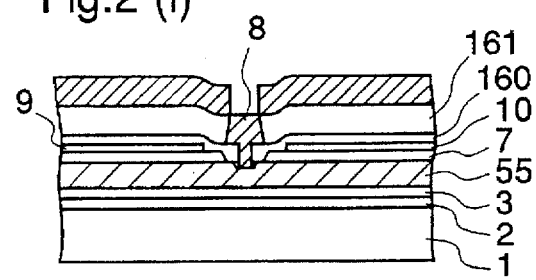
Figure 2:
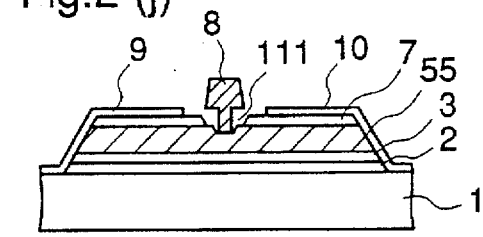
Figure 2:
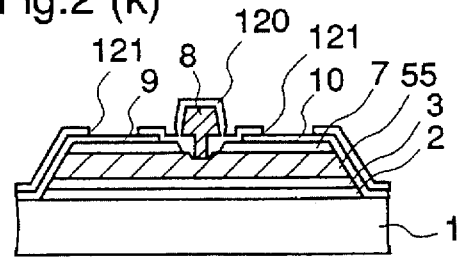

FIGS. 2(a)–2(k) are cross-sectional views illustrating process steps in fabricating the HEMT according to the first embodiment of the invention. Initially, as illustrated in FIG. 2(a), the undoped AlInAs buffer layer 2, the undoped InGaAs channel layer 3, the Te-doped n type $Al_{x1}Ga_{1-x1}As_{y1}P_{z1}Sb_{1-y1-z1}$ electron supply layer 55, and the n type InGaAs contact layer 7 are successively grown on the semi-insulating InP substrate 1. Preferably, these layers are grown by MBE (Molecular Beam Epitaxy), and the group III and V source materials employed in the MBE are solid. Alternatively, these layers may be grown by MOMBE (Metal Organic Molecular Beam Epitaxy), gas source MBE, or MOCVD (Metal Organic Chemical Vapor Deposition). In these cases, triethylgallium (TEG) and trimethylaminealanine (TMAAl) are employed as organic metal source materials (group III source materials), and stibine ($SbH_3$), tris-dimethylaminostibine (TDMASb), $PH_3$, and $AsH_3$ are employed as group V source materials. The growth temperature is about 500° C.

In the step of FIG. 2(b), portions of the grown layers are etched and removed to form a mesa structure in a region where an HEMT is fabricated. Thereafter, the source electrode 9 and the drain electrode 10 are produced on the contact layer 7 (FIG. 2(c)). Then, a portion of the contact layer 7 between the source electrode 9 and the drain electrode 10 is etched and removed to expose the surface of the electron supply layer 55 (FIG. 2(d)).

In the step of FIG. 2(e), an EB (electron beam) resist 160 and a photoresist 161 are applied to the entire surface of the structure, and the photoresist 161 is exposed to light except a region where an upper part of a T-shaped gate electrode is later produced, and a portion of the photoresist 161 in the region where the upper part of the gate electrode is later produced is removed by developing, producing an opening 163 in the photoresist 161.

Thereafter, a portion of the EB resist 160 in a region where a lower part of the gate electrode is later produced is irradiated with an electron beam 164 through the opening 163 (FIG. 2(f)), and the irradiated portion of the EB resist 160 is removed by developing to form an opening 165 (FIG. 2(g)).

In the step of FIG. 2(h), using the EB resist 160 as a mask, the surface of the electron supply layer 55 is etched to a prescribed depth, producing a recess 111 under the opening 165 of the EB resist. Thereafter, Ti/Pt/Au is deposited over the entire surface (FIG. 2(i)) by vacuum evaporation, and the resists 160 and 161 and unnecessary portions of the Ti/Pt/Au are removed by the lift-off technique, whereby a T-shaped gate electrode 8 comprising an wide upper part and a narrow lower part is produced. Finally, as illustrated in FIG. 2(k), an SiON film 120 for passivation is deposited over the entire surface, and portions of the SiON film 120 opposite the source and drain electrodes 9 and 10 are removed to form openings 121, completing the HEMT shown in FIG. 1. In FIG. 1, however, the SiON film 120 for passivation is not shown. Further, in FIGS. 2(e)–2(i), only a center part of the structure where a gate electrode will be produced is shown, and the mesa structure is not shown.

In this first embodiment of the invention, the electron supply layer 55 comprises n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) which has a high thermal stability. Therefore, the electrical characteristics of the HEMT are not varied by a heat treatment at about 350° C. As a result, a thermally stable and highly reliable HEMT is realized, and the characteristics of the HEMT are hardly changed with the passage of time during fabrication and operation.

Figure 3:
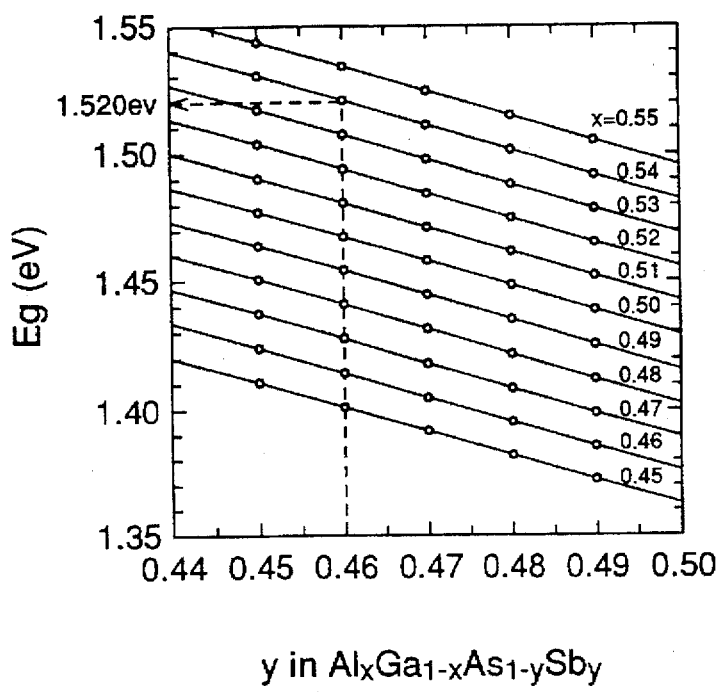
FIG. 3(a) is a diagram illustrating the relationship between energy band gap (Eg) and compositions (x,y) in $Al_xGa_{1-x}As_{1-y}Sb_y$.
FIG. 3(b) is a diagram illustrating the relationship between lattice constant (a) and compositions (x,y) in $Al_xGa_{1-x}As_{1-y}Sb_y$.
Figure 3:
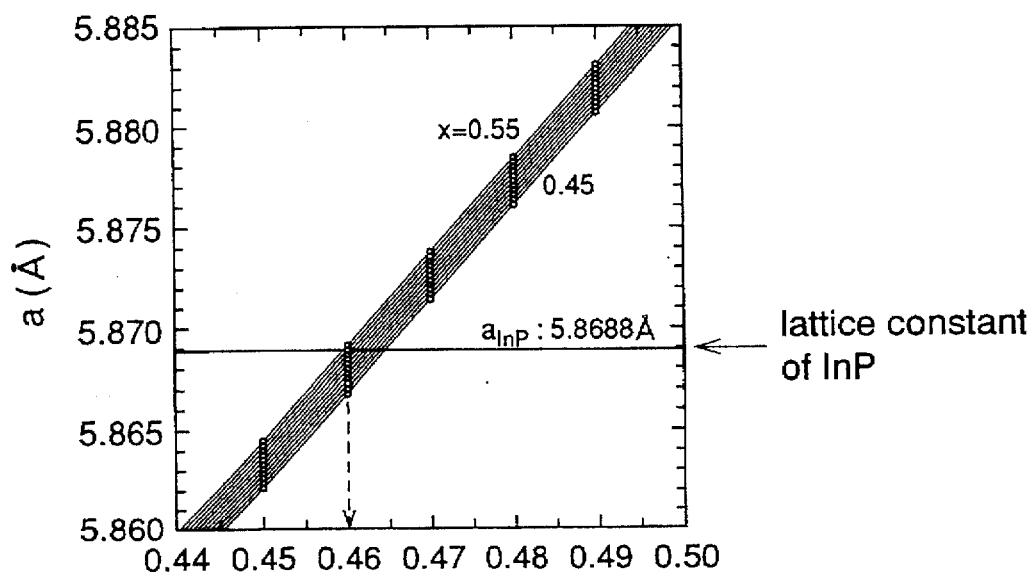
Figure 4:
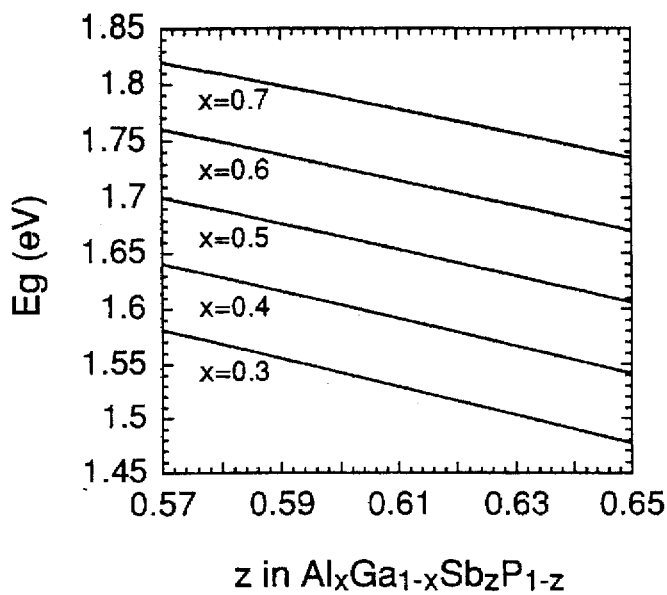
FIG. 4(a) is a diagram illustrating the relationship between energy band gap (Eg) and compositions (x,z) in $Al_xGa_{1-x}Sb_zP_{1-z}$.
FIG. 4(b) is a diagram illustrating the relationship between lattice constant (a) and compositions (x,z) in $Al_xGa_{1-x}Sb_zP_{1-z}$.
Figure 4:
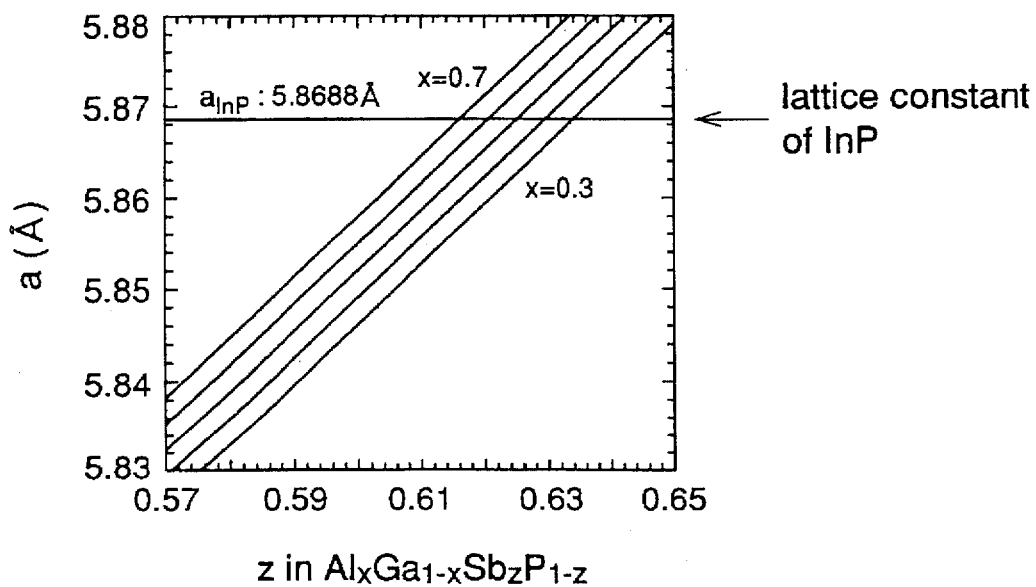

Furthermore, in this first embodiment of the invention, the degree of freedom in designing the device is improved as described hereinafter. FIGS. 3(a) and 3(b) are graphs illustrating composition dependence of energy band gap and composition dependence of lattice constant (a) of n type $Al_xGa_{1-x}As_yP_zSb_{1-y-z}$ (z=0), respectively. FIGS. 4(a) and 4(b) are graphs illustrating composition dependence of energy band gap (Eg) and composition dependence of lattice constant (a) of n type $Al_xGa_{1-x}As_yP_zSb_{1-y-z}$ (y=0), respectively. In FIGS. 3(a) and 3(b), the composition y is replaced with 1-y. In FIGS. 4(a) and 4(b), the composition z is replaced with 1-z. As seen from these figures, in AlGaAsPSb, the energy band gap Eg can be varied in a wide range while lattice-matching with an InP substrate by changing the compositions x, y, and z. In addition, when the compositions are changed while appropriately maintaining the relationship between y and x or between z and x, the band discontinuity at the heterointerface between a conduction band energy Ec and a valence band energy Ev can be varied without changing the energy band gap Eg. In this way, when $Al_xGa_{1-x}As_yP_zSb_{1-y-z}$ is employed, an electron supply layer/channel layer heterojunction structure having a desired energy band structure is easily produced with a high degree of freedom, whereby the degree of freedom in designing the device is significantly increased.

Japanese Published Patent Application No. Hei. 3-88340 discloses an HEMT employing AlGaAsSb for an electron supply layer. However, this HEMT has drawbacks.

Figure 5:
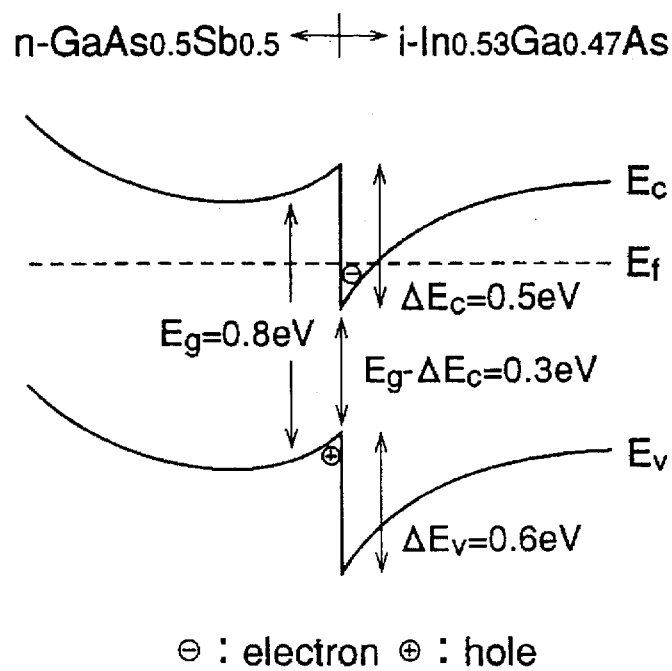
FIG. 5(a) is a diagram illustrating an energy band structure at a heterointerface between an n type $GaAs_{0.5}Sb_{0.5}$ layer and an undoped $In_{0.53}Ga_{0.47}As$ layer.
FIG. 5(b) is a diagram illustrating an energy band structure at a heterointerface between an n type GaAsPSb layer and an undoped $In_{0.53}Ga_{0.47}As$ channel layer.
Figure 5:
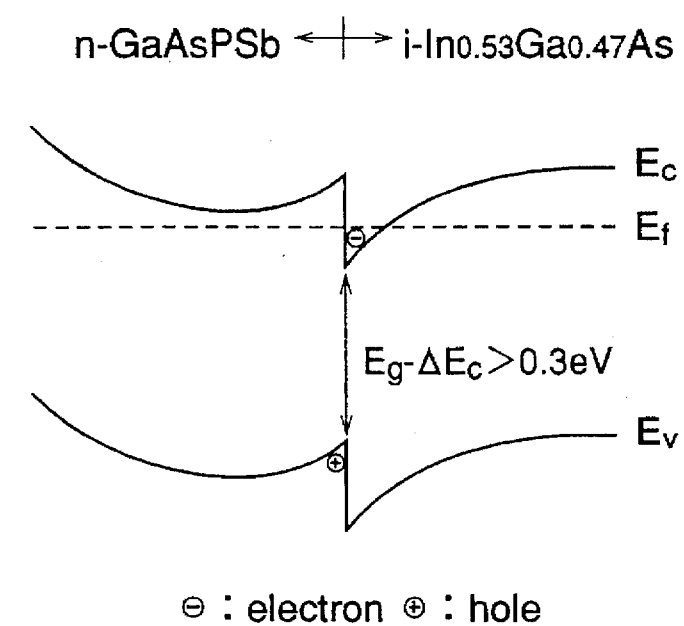

In order to explain the drawbacks of the prior art HEMT, a HEMT employing GaAsSb for an electron supply layer will be described because these HEMTs are fundamentally identical. FIG. 5(a) is an energy band diagram of an HEMT employing $GaAs_{0.5}Sb_{0.5}$ for an electron supply layer. In the figure, reference character Ec denotes the energy at the lower end of the conduction band, Ev denotes the energy at the upper end of the valence band, Ef denotes the Fermi energy, Eg denotes the energy band gap, ΔEc denotes the conduction band discontinuity at the heterointerface between the GaAsSb electron supply layer and the InGaAs channel layer, and ΔEv denotes the valence band discontinuity at the heterointerface. In this structure, $GaAs_{0.5}Sb_{0.5}$ lattice-matches with InP. As shown in FIG. 5(a), at the heterointerface between the GaAsSb electron supply layer and the InGaAs channel layer, the conduction band discontinuity ΔEc is 0.5 eV and the valence band discontinuity ΔEv is 0.6 eV. At this time, Eg–ΔEc is as small as 0.3 eV and, therefore, recombination of electrons and holes easily occurs at the heterointerface and charge carriers are reduced due to the recombination. As a result, a high concentration of electrons cannot be obtained in the channel layer. When P is added to GaAsSb, in other words, when GaAsPSb is employed for the electron supply layer, the energy band structure is changed as shown in FIG. 5(b). That is, the energy band gap Eg is increased and the conduction band discontinuity ΔEc is decreased, so that Eg–ΔEc becomes larger than 0.3 eV. Thereby, the recombination of charge carriers at the heterointerface is suppressed, whereby the operating characteristics of the HEMT are improved. The same effect as provided by the GaAsPSb electron supply layer is obtained when AlGaAsPSb is used for the electron supply layer. That is, since the HEMT according to the first embodiment of the invention employs AlGaAsPSb for the electron supply layer 55, the recombination of charge carriers at the heterointerface is suppressed as compared to the prior art HEMT employing AlGaAsSb. Therefore, the carrier concentration in the channel layer is increased, whereby the operating characteristics of the HEMT are improved.

[Embodiment 2]

Figure 6:
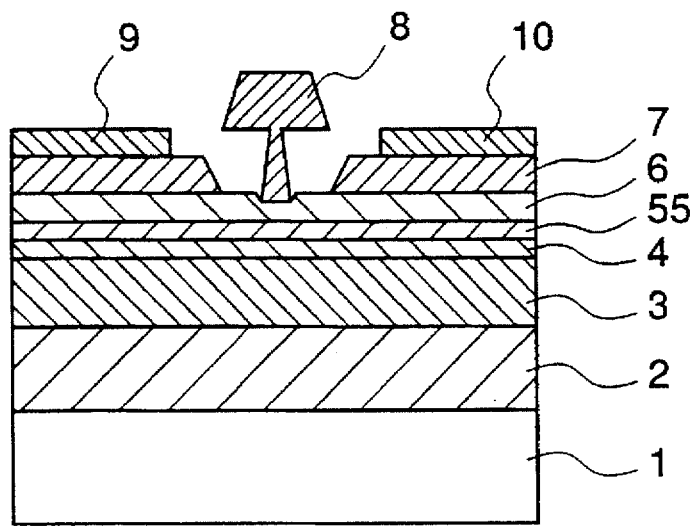
FIG. 6 is a cross-sectional view illustrating a HEMT in accordance with a second embodiment of the present invention.

FIG. 6 is a cross-sectional view illustrating an HEMT employing n type AlGaAsPSb for an electron supply layer in accordance with a second embodiment of the present invention. In FIG. 6, the same reference numerals as those shown in FIG. 1 designate the same or corresponding parts. The HEMT according to this second embodiment is fundamentally identical to the HEMT according to the first embodiment except that an undoped AlInAs spacer layer 4 having a very low impurity concentration and a thickness of 5 nm is interposed between the n type AlGaAsPSb electron supply layer 55 and the InGaAs channel layer 3, and an undoped AlInAs Schottky layer 6 having a very low impurity concentration and a thickness of 20 nm is disposed on the electron supply layer 55. The gate electrode 8 is disposed on the Schottky layer 6.

Figure 7:
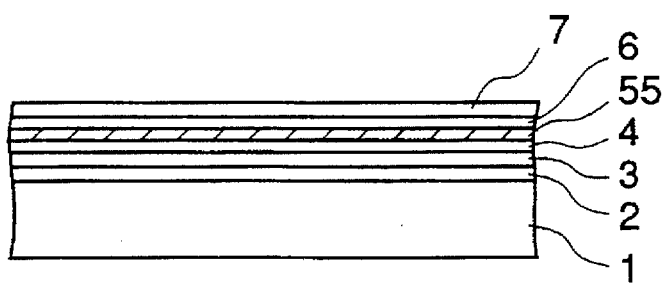
FIGS. 7(a) and 7(b) are cross-sectional views illustrating process steps in a method of fabricating the HEMT shown in FIG. 6.
Figure 7:
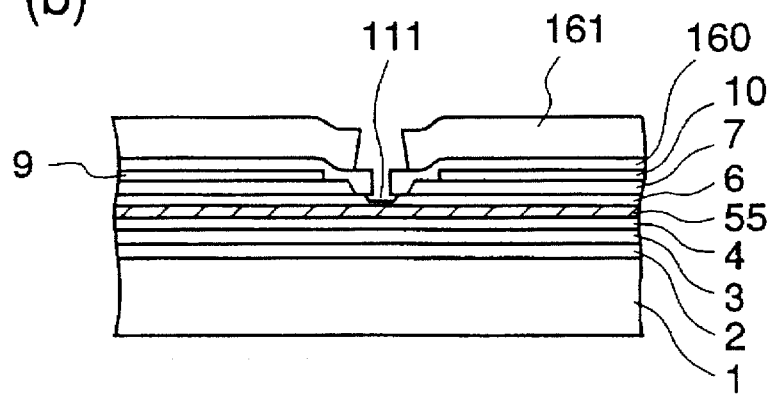

FIGS. 7(a) and 7(b) are cross-sectional views illustrating process steps in a method of fabricating the HEMT shown in FIG. 6.

Initially, as illustrated in FIG. 7(a), the undoped AlInAs buffer layer 2, the undoped InGaAs channel layer 3, the undoped AlInAs spacer layer 4, the Te-doped n type $Al_{x1}Ga_{1-x1}As_{y1}P_{z1}Sb_{1-y1-z1}$ electron supply layer 55, the undoped AlInAs Schottky layer 6, and the n type InGaAs contact layer 7 are successively grown on the semi-insulating InP substrate 1, preferably by MBE, MOMBE, gas source MBE, or MOCVD. Thereafter, the grown layers are subjected to process steps identical to those already described with respect to FIGS. 2(b)–2(g).

In the step of FIG. 7(b), using the EB resist 160 and the photoresist 161 as masks, the surface of the Schottky layer 6 is etched to a prescribed depth, producing a recess 111 opposite the opening of the EB resist 160. The HEMT shown in FIG. 6 is completed through process steps identical to those already described with respect to FIGS. 2(i)–2(k). In FIG. 6, the passivating film is not shown.

In this second embodiment of the invention, the spacer layer 4 prevents impurities in the electron supply layer 55 from diffusing into the channel layer 3, so that unwanted reduction in the electron mobility in the channel layer 3 due to the impurity diffusion is avoided. In addition, the spacer layer 4 keeps the channel layer 3 away from the ionized impurity doped electron supply layer 55, so that Coulomb scattering of 2-DEG is suppressed, resulting in a high electron mobility. While in the first embodiment of the invention the gate electrode 8 is disposed on the surface of the electron supply layer 55 that is highly doped with dopant impurity producing n type conductivity, in this second embodiment the gate electrode 8 is disposed on the surface of the undoped AlInAs Schottky layer 6 having a very low impurity concentration. Therefore, the contact of the gate electrode 8 with the Schottky layer 6 is a satisfactory Schottky contact.

Furthermore, since n type AlGaAsPSb is employed for the electron supply layer 55, a thermally stable and highly reliable HEMT is realized, and the degree of freedom in design is increased. In addition, recombination of charge carriers at the heterointerface of the channel layer and the electron supply layer is suppressed, whereby the carrier concentration of the channel layer is increased.

Although the spacer layer 4 and the Schottky layer 6 comprise AlInAs, since these layers are undoped, in contrast to n type AlInAs, the carrier concentration is not varied due to heat. However, the problem of a low degree of freedom in design remains.

Figure 8:
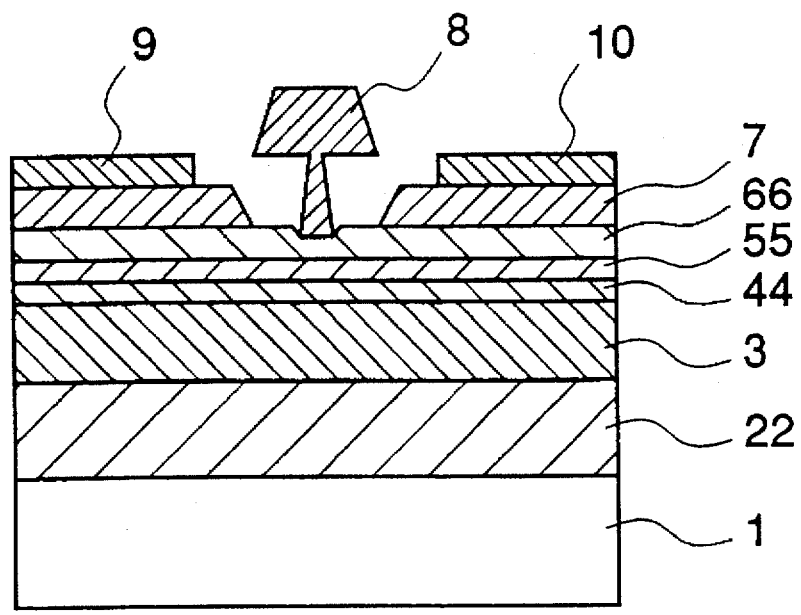
FIG. 8 is a cross-sectional view illustrating an HEMT in accordance with a modification of the second embodiment of the invention.

This problem is solved in an HEMT shown in FIG. 8 according to a modification of the second embodiment of the invention. The HEMT includes an undoped $Al_{x2}Ga_{1-x2}As_{y2}P_{z2}Sb_{1-y2-z2}$ $x2As_{y2}P_{z2}Sb_{1-y2-z2}$ ($0 \leq x2 \leq 1$, $0 \leq y2 < 1$, $0 < z2 \leq 1$) spacer layer 44 and an undoped $Al_{x3}Ga_{1-x3}As_{y3}P_{z3}Sb_{1-y3-z3}$ ($0 \leq x3 \leq 1$, $0 \leq y3 < 1$, $0 < z3 \leq 1$) Schottky layer 66. Alternatively, one of the spacer layer and the Schottky layer may comprise AlGaAsPSb while the other comprises AlInAs. Further, in place of the undoped AlInAs buffer layer 2, an undoped $Al_{x4}Ga_{1-x4}As_{y4}P_{z4}Sb_{1-y4-z4}$ ($0 \leq x4 \leq 1$, $0 \leq y4 < 1$, $0 < z4 \leq 1$) buffer layer 22 may be employed. Thereby, the switching of supplied materials is facilitated when the semiconductor layers constituting the HEMT are grown.

[Embodiment 3]

Figure 9:
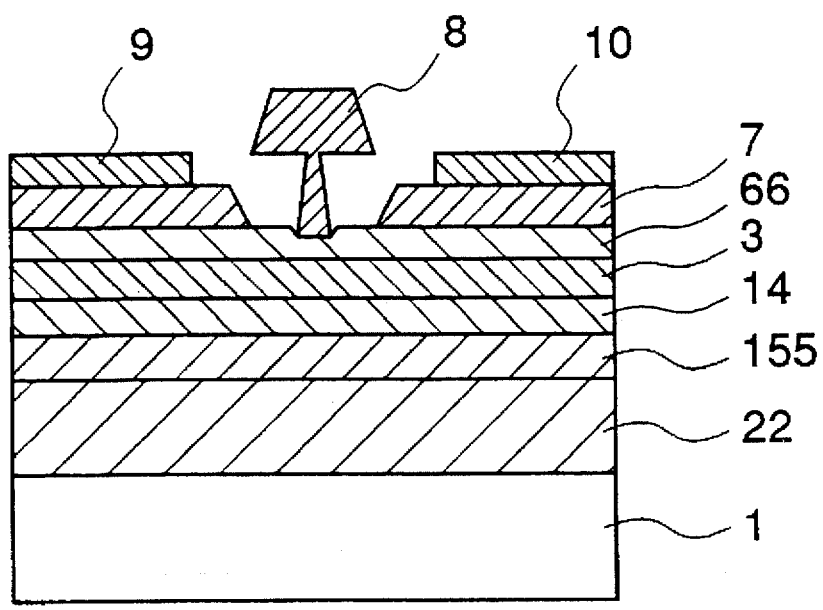
FIG. 9 is a cross-sectional view illustrating a HEMT in accordance with a third embodiment of the present invention.

FIG. 9 is a cross-sectional view illustrating an HEMT employing an n type AlGaAsPSb electron supply layer in accordance with a third embodiment of the invention. In the figure, the same reference numerals as those shown in FIG. 8 designate the same or corresponding parts. The HEMT according to this third embodiment is fundamentally identical to the HEMT shown in FIG. 8 according to the modification of the second embodiment except that the electron supply layer is disposed on the substrate side of the channel layer whereas it is disposed on the gate side of the channel layer in the second embodiment. This structure is called a reverse HEMT structure. More specifically, in the HEMT shown in FIG. 9, a Te-doped n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) electron supply layer 155 having a thickness of 7 nm and a dopant concentration of $4 \times 10^{18}$ cm$^{-3}$ is disposed on the buffer layer 22, an undoped $Al_{x2}Ga_{1-x2}As_{y2}P_{z2}Sb_{1-y2-z2}$ ($0 \leq x2 \leq 1$, $0 \leq y2 < 1$, $0 < z2 \leq 1$) spacer layer 14 having a thickness of 5 nm and a very low impurity concentration is disposed on the electron supply layer 155, and an InGaAs channel layer 3 having a thickness of 30 nm is disposed on the spacer layer 14. Although the spacer layer 14, the buffer layer 22, and the Schottky layer 66 comprise undoped AlGaAsPSb, these layers may comprise undoped AlInAs. The spacer layer 14 may be dispensed with.

A description is given of the method for fabricating the HEMT shown in FIG. 9. Initially, the undoped AlGaAsPSb buffer layer 22, the Te-doped n type $Al_{x1}Ga_{1-x1}As_{y1}P_{z1}Sb_{1-y1-z1}$ electron supply layer 155, the undoped AlGaAsPSb spacer layer 14, the undoped InGaAs channel layer 3, the undoped AlGaAsPSb Schottky layer 66, and the n type InGaAs contact layer 7 are successively grown on the semi-insulating InP substrate 1, preferably by MBE, MOMBE, gas source MBE, or MOCVD. Thereafter, the HEMT is completed through process steps identical to those already described with respect to FIGS. 2(b) to 2(k). The passivating film is not shown in FIG. 9.

In this third embodiment of the invention, only the undoped Schottky layer 66 is present between the channel layer 3 and the gate electrode 8, and the electron supply layer 155 that is highly doped with a dopant impurity producing n type conductivity is disposed on the substrate side of the channel layer 3. Therefore, the gate breakdown voltage is increased as compared with the HEMTs according to the first and second embodiments. In addition, the influence of changes in the surface condition of the semiconductor layer on the device characteristics is reduced.

Furthermore, since n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) is employed for the electron supply layer 155, a thermally stable and highly reliable HEMT is realized, and the degree of freedom in design is increased. In addition, recombination of charge carriers at the heterointerface of the channel layer and the electron supply layer is suppressed, whereby the carrier concentration of the channel layer is increased.

[Embodiment 4]

Figure 10:
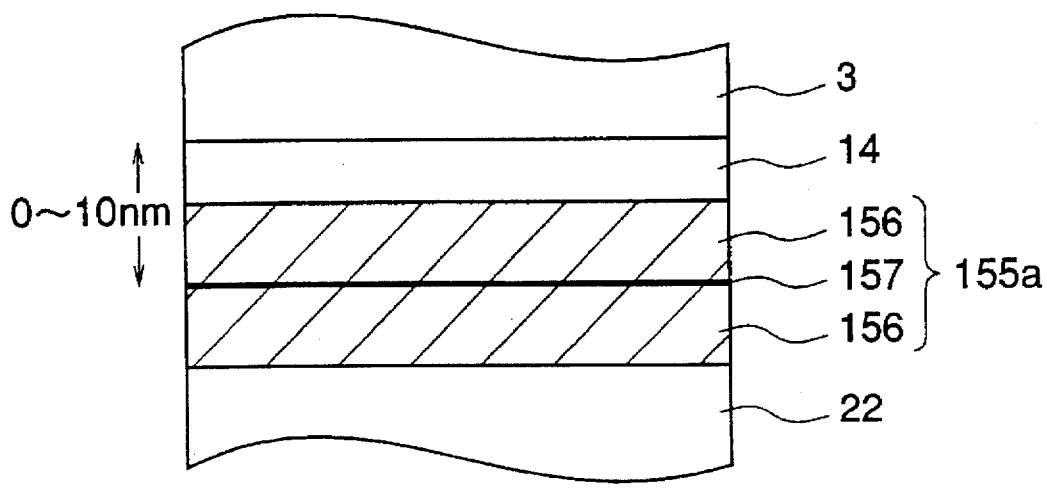
FIG. 10 is a cross-sectional view illustrating a part of an HEMT in the vicinity of an electron supply layer, according to a fourth embodiment of the present invention.

FIG. 10 is a cross-sectional view illustrating a part of a HEMT in the vicinity of an electron supply layer, according to a fourth embodiment of the invention. In the figure, the same reference numerals as those shown in FIG. 9 designate the same or corresponding parts. The HEMT according to this fourth embodiment is fundamentally identical to the HEMT according to the third embodiment except that an electron supply layer 155a comprising an undoped $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) layer 156 having a thin Te-doped region, i.e., an atomic planar Te-doped region 157, is employed in place of the n type AlGaAsPSb electron supply layer 155 in which Te is uniformly distributed. The distance from the atomic planar Te-doped region 157 to the surface of the channel layer 3 on the electron supply layer side is desired to be 0~10 nm. The sheet carrier concentration of the atomic planar Te-doped region 157 is desired to be on the order of $10^{12}$ cm$^{-2}$. For example, Te is doped to a concentration of $3 \times 10^{12}$ cm$^{-2}$.

Although in this fourth embodiment the atomic planar doped electron supply layer 155a is employed in place of the electron supply layer 155 on the substrate side of the carrier layer according to the third embodiment, it may be employed in place of the electron supply layer 55 on the gate side of the carrier layer as in the first and second embodiments of the invention. In this case, the distance from the atomic planar Te-doped region 157 to the channel layer 3 is about 5 nm, and the sheet carrier concentration of the atomic planar Te-doped region 157 is about $5 \times 10^{12}$ cm$^{-2}$.

A description is given of the method of growing the electron supply layer 155a. Initially, an undoped AlGaAsPSb layer 156 is grown to a prescribed thickness. Thereafter, Te is added as a dopant from the surface of the AlGaAsPSb layer 156 to a prescribed surface density, thereby producing an atomic planar Te-doped region 157.

Further, an undoped AlGaAsPSb layer 156 having a prescribed thickness is grown on this region. The process steps for fabricating the HEMT according to this fourth embodiment are identical to those described with respect to the first to third embodiments except that the electron supply layer 155a is produced using the doping method described above.

In this fourth embodiment, since the atomic planar Te-doped region 157 having a high dopant concentration and serving as an electron supply source is disposed in the vicinity of the channel layer 3, a high concentration 2-DEG is produced in the channel layer 3, whereby the carrier concentration of the channel layer 3 is increased, resulting in a high-performance HEMT.

Furthermore, since n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) is employed for the electron supply layer 155a, a thermally stable and highly reliable HEMT is realized, and the degree of freedom in design is increased. In addition, recombination of charge carriers at the heterointerface of the channel layer and the electron supply layer is suppressed, whereby the carrier concentration of the channel layer is increased.

[Embodiment 5]

Figure 11:
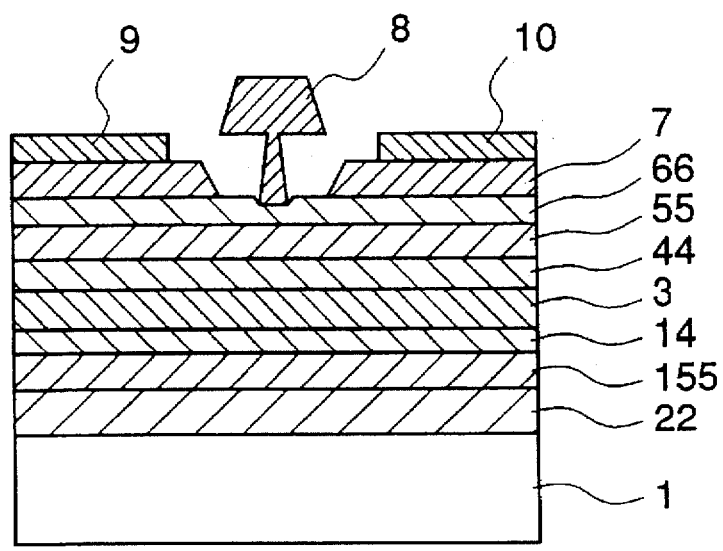
FIG. 11 is a cross-sectional view illustrating an HEMT in accordance with a fifth embodiment of the present invention.

FIG. 11 is a cross-sectional view illustrating an HEMT according to a fifth embodiment of the present invention. In the figure, the same reference numerals as those shown in FIGS. 8 and 9 designate the same or corresponding parts. The HEMT according to this fifth embodiment includes both a gate side electron supply layer 55 according to the first and second embodiments and a substrate side electron supply layer 155 according to the third embodiment. More specifically, a Te-doped n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) electron supply layer 55 is disposed on the gate side of the InGaAs channel layer 3, and an undoped $Al_{x2}Ga_{1-x2}As_{y2}P_{z2}Sb_{1-y2-z2}$ ($0 \leq x2 \leq 1$, $0 \leq y2 < 1$, $0 < z2 \leq 1$) spacer layer 44 is disposed between the channel layer 3 and the gate side electron supply layer 55. Further, a Te-doped n type $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) electron supply layer 155 is disposed on the substrate side of the channel layer 3, and an undoped $Al_{x2}Ga_{1-x2}As_{y2}P_{z2}Sb_{1-y2-z2}$ ($0 \leq x2 \leq 1$, $0 \leq y2 < 1$, $0 < z2 \leq 1$) spacer layer 14 is disposed between the channel layer 3 and the substrate side electron supply layer 155. This structure is called a double-doped HEMT structure. Also in this fifth embodiment, the spacer layers 14 and 44, the buffer layer 22, and the Schottky layer 66 may comprise undoped AlInAs. The spacer layers 14 and 44 may be dispensed with.

Figure 12:
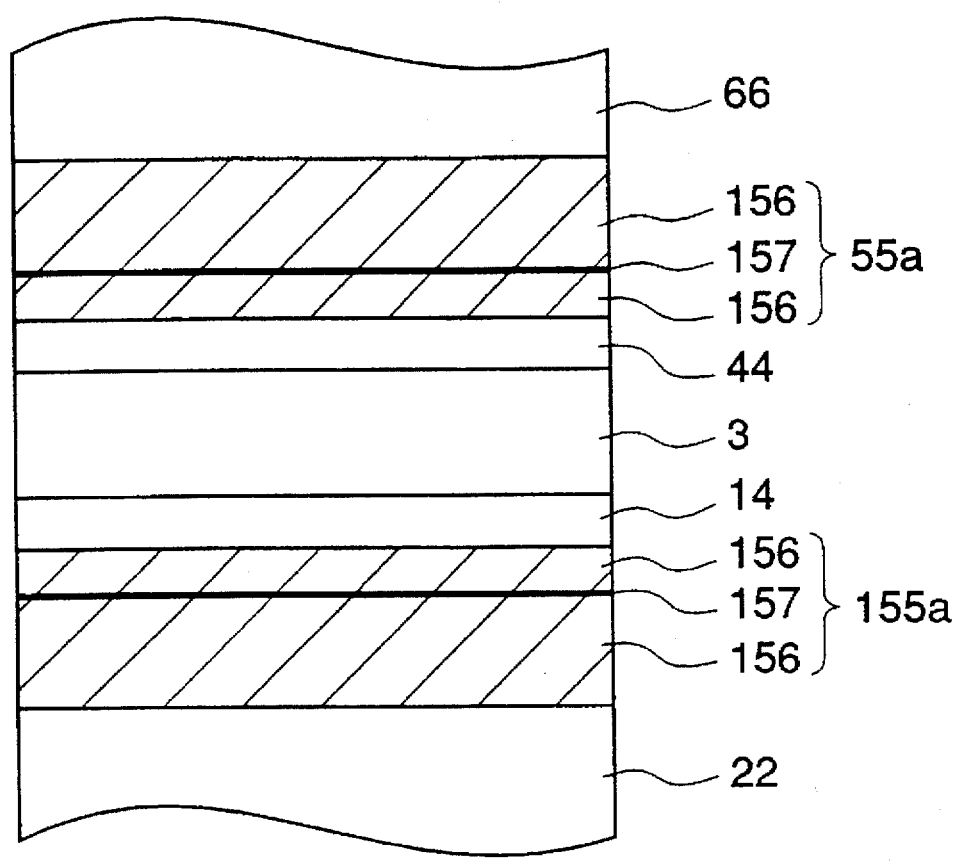
FIG. 12 is a cross-sectional view illustrating a part of an HEMT in the vicinity of an electron supply layer, according to a fifth embodiment of the present invention.

The gate side electron supply layer 55 and the substrate side electron supply layer 155 may have either the uniformly Te-doped structure according to the first to third embodiments or the atomic planar Te-doped structure according to the fourth embodiment. FIG. 12 is a cross-sectional view illustrating a part of an HEMT including a gate side electron supply layer 55a and a substrate side electron supply layer 155a both comprising atomic planar Te-doped AlGaAsPSb. In the figure, reference numerals 156 and 157 designate an undoped AlGaAsPSb layer and an atomic planar Te-doped region, respectively.

A description is given of the method of fabricating the HEMT shown in FIG. 11. Initially, the undoped AlGaAsPSb buffer layer 22, the Te-doped n type AlGaAsPSb substrate side electron supply layer 155, the undoped AlGaAsPSb spacer layer 14, the undoped InGaAs channel layer 3, the undoped AlGaAsPSb spacer layer 44, the Te-doped n type AlGaAsPSb gate side electron supply layer 55, the undoped AlGaAsPSb Schottky layer 66, and the n type InGaAs contact layer 7 are successively grown on the semi-insulating InP substrate 1, preferably by MBE, MOMBE, gas source MBE, or MOCVD. The HEMT is completed through process steps identical to those already described with respect to FIGS. 2(b) to 2(k). The passivating film is not shown in FIG. 11.

The method of fabricating the structure shown in FIG. 12 in which both the gate side electron supply layer 55a and the substrate side electron supply layer 155a comprise atomic planar Te-doped AlGaAsPSb is identical to the method described above except that these electron supply layers are produced using the Te-doping method described with respect to the fourth embodiment.

In this fifth embodiment of the invention, since the electron supply layers 55 (55a) and 155 (155a) are disposed on both the gate side and the substrate side of the channel layer 3, a high concentration 2-DEG is produced in the channel layer, resulting in an HEMT suitable for high-power output operation that requires high current driving ability.

Further, since $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) is employed for the electron supply layers, a thermally stable and highly reliable HEMT is realized, and the degree of freedom in design is increased. In addition, recombination of charge carriers at the heterointerface of the channel layer and the electron supply layer is suppressed, the carrier concentration of the channel layer is increased.

[Embodiment 6]

Figure 13:
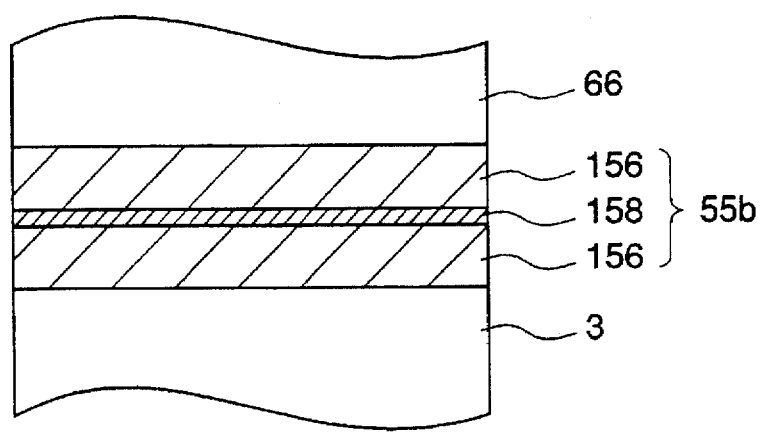
FIG. 13(a) is a cross-sectional view illustrating a part of an HEMT in the vicinity of an electron supply layer including an n type AlGaAsPSb quantum well region according to a sixth embodiment of the invention.
FIG. 13(b) is a diagram illustrating an energy band structure at a heterointerface between the electron supply layer and an undoped InGaAs channel layer.
FIG. 13(c) is a diagram illustrating an energy band structure at a heterointerface between an AlGaAsPSb electron supply layer that is uniformly doped with a dopant impurity producing n type conductivity and an undoped InGaAs channel layer.
Figure 13:
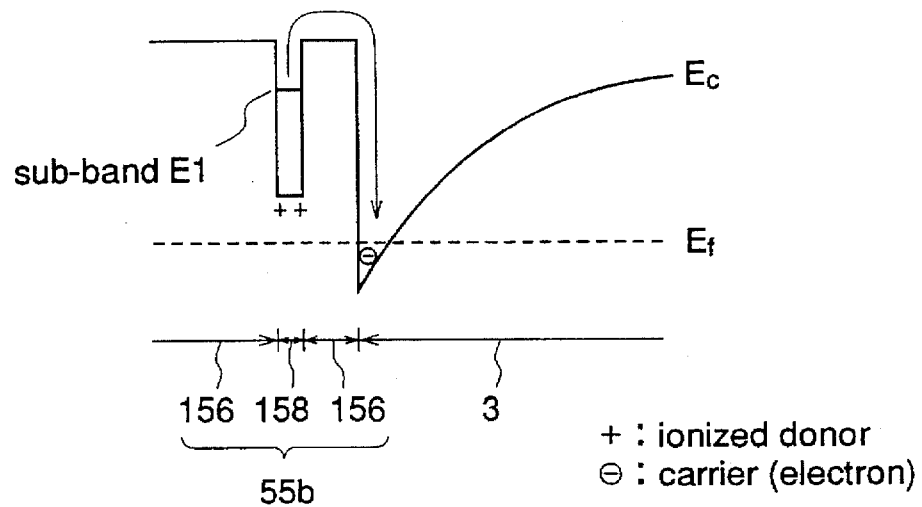
Figure 13:
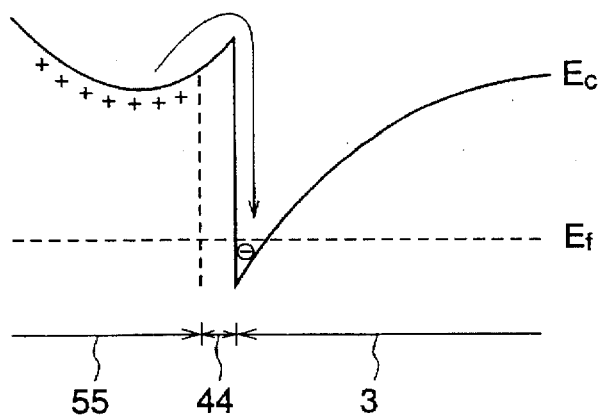

FIG. 13(a) is a cross-sectional view illustrating a part of an HEMT in the vicinity of an electron supply layer, according to a sixth embodiment of the present invention. The HEMT according to this sixth embodiment is fundamentally identical to the HEMT shown in FIG. 8 according to the second embodiment except that an electron supply layer 55b comprising upper and lower undoped $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) layers 156 and an n type AlGaAsPSb quantum well layer 158 disposed between the undoped AlGaAsPSb layers 156 is employed in place of the n type AlGaAsPSb electron supply layer 55 in which an n type producing dopant, Te, is uniformly doped. The composition of the n type AlGaAsPSb quantum well layer 158 is selected so that the energy band gap Eg of the quantum well layer 158 becomes smaller than that of the undoped AlGaAsPSb layers 156. More specifically, the quantum well layer 158 is highly doped with a dopant impurity producing n type conductivity, i.e., to a concentration exceeding $10^{18}$ cm$^{-3}$. The thickness of the quantum well layer 158 is 1–5 nm. Although the quantum well layer 158 is included in the gate side electron supply layer in the HEMT shown in FIG. 13(a), it may be included in the substrate side electron supply layer.

The process steps for fabricating the HEMT shown in FIG. 13(a) are fundamentally identical to those already described with respect to the first to fifth embodiments except that the electron supply layer 55b is produced by successively growing the lower undoped AlGaAsPSb layer 156, the quantum well layer 158, and the upper undoped AlGaAsPSb layer 156.

FIG. 13(b) is an energy band diagram of the HEMT including the electron supply layer 55b according to this sixth embodiment, and FIG. 13(c) is an energy band diagram of the HEMT including the electron supply layer 55 which is uniformly doped. In the HEMT shown in FIG. 13(b), ionized donors in the quantum well of the quantum well layer 158 produce the sub-band E1. Therefore, compared to the HEMT shown in FIG. 13(c), electrons are supplied into the channel layer 3 with high efficiency, whereby the concentration of electrons as charge carriers in the channel layer 3 is increased. As a result, the electrical characteristics of the HEMT are improved.

Furthermore, since AlGaAsPSb is employed for the electron supply layer 55b, a thermally stable and highly reliable HEMT is realized, and the degree of freedom in design is increased. In addition, recombination of charge carriers at the heterointerface of the channel layer and the electron supply layer is suppressed, the carrier concentration of the channel layer is increased.

[Embodiment 7]

Figure 14:
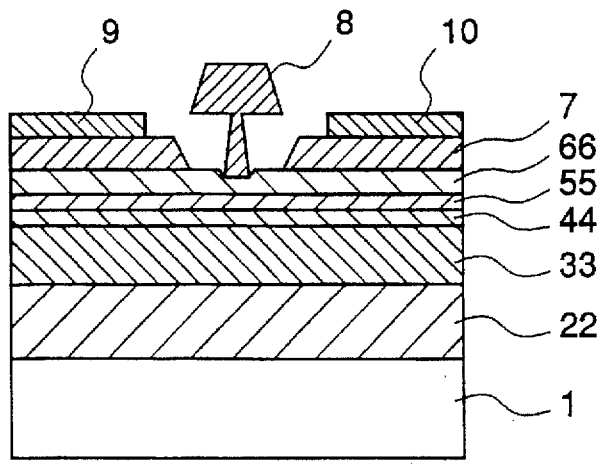
FIG. 14 is a cross-sectional view illustrating a HEMT in accordance with a seventh embodiment of the present invention.
Figure 16:
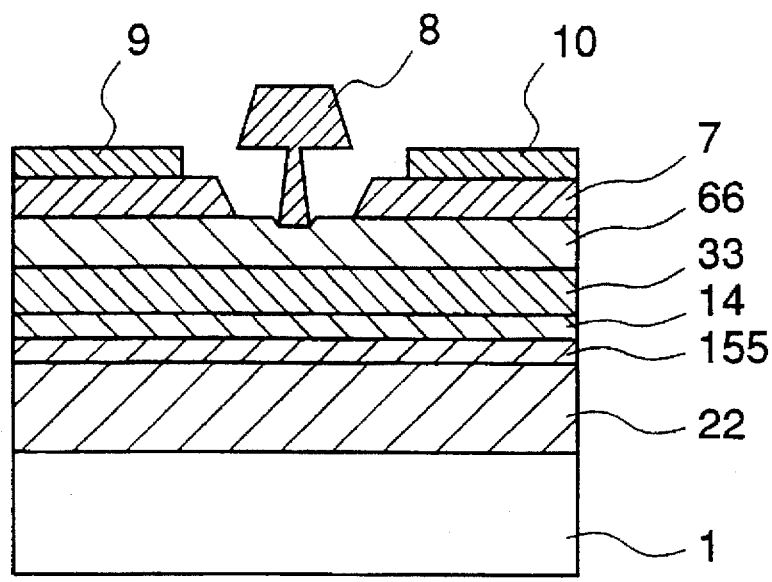
FIG. 16 is a cross-sectional view illustrating an HEMT in accordance with a modification of the seventh embodiment of the invention.
Figure 17:
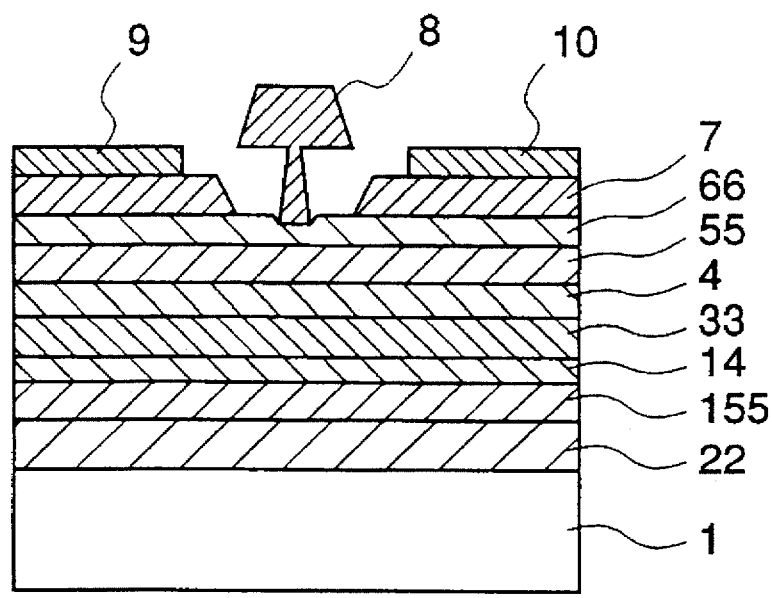
FIG. 17 is a cross-sectional view illustrating an HEMT in accordance with another modification of the seventh embodiment of the invention.

FIG. 14 is a cross-sectional view illustrating an HEMT according to a seventh embodiment of the present invention. In the figure, the same reference numerals as those shown in FIG. 8 designate the same or corresponding parts. While in the first to sixth embodiments an undoped $In_{0.53}Ga_{0.47}As$ channel layer 3 that lattice-matches with the InP substrate 1 is employed, in this seventh embodiment an undoped $In_xGa_{1-x}As$ ($0.53<x\leq 1$) channel layer 33 is employed. Even when the channel layer comprises a material having a composition that does not lattice-match with the substrate, if the thickness of the channel layer is less than the critical thickness, the channel layer becomes a strained lattice layer and lattice-matches with the substrate. A structure including such strained lattice layer is called a pseudomorphic structure. In FIG. 14, the strained lattice channel layer 33 is employed in an HEMT including a gate side electron supply layer 55. FIG. 16 shows an HEMT including a substrate side electron supply layer 155 and a strained lattice channel layer 33 according to this seventh embodiment. FIG. 17 shows an HEMT including both a gate side electrode supply layer 55 and a substrate side electron supply layer 155, and a strained lattice channel layer 33 according to this seventh embodiment.

The process steps for fabricating the HEMT according to this seventh embodiment are fundamentally identical to those described with respect to the first to sixth embodiments except the growth of the undoped $In_xGa_{1-x}As$ ($0.53<x\leq 1$) channel layer 33.

Figure 15:
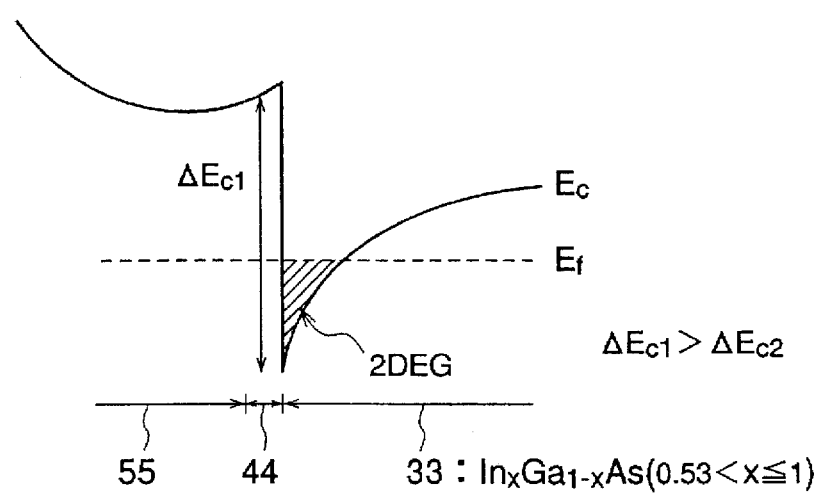
FIG. 15(a) is a diagram illustrating an energy band structure at a heterointerface between an n type AlGaAsPSb electron supply layer and an undoped $In_xGa_{1-x}As$ ($0.53 < x \leq 1$) strained lattice channel layer in accordance with the seventh embodiment of the invention.
FIG. 15(b) is a diagram illustrating an energy band structure at a heterointerface between an n type AlGaAsPSb electron supply layer and an undoped $In_{0.53}Ga_{0.47}As$ channel layer.
Figure 15:
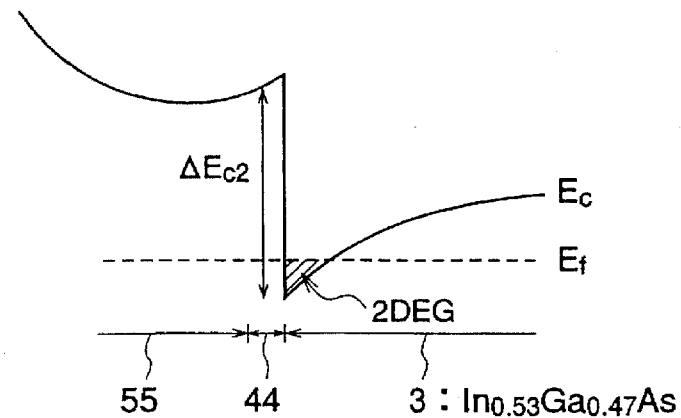

FIG. 15(a) is an energy band diagram of the HEMT including the strained lattice active layer 33 according to this seventh embodiment, and FIG. 15(b) is an energy band diagram of the HEMT including the $In_{0.53}Ga_{0.47}As$ channel layer 3 that lattice-matches with the InP substrate. In this seventh embodiment, as shown in FIG. 15(a), the undoped $In_xGa_{1-x}As$ strained lattice channel layer 33 having an In composition x larger than 0.53 is employed. Therefore, compared with the HEMT shown in FIG. 15(b), the band discontinuity $\Delta Ec$ between the channel layer and the electron supply layer in the conduction band is increased ($\Delta Ec1 > \Delta Ec2$), whereby a high 2-DEG concentration is obtained. Since, in InGaAs, the electron mobility and the saturation speed increase with an increase in the In composition, the electron mobility and the saturation speed of the $In_xGa_{1-x}As$ ($0.53<x\leq 1$) strained lattice channel layer 33 are higher than those of the $In0.53Ga_{0.47}As$ channel layer 3. Therefore, a high 2-DEG concentration is obtained in the strained lattice channel layer 33, and the electron mobility and saturation speed are increased, whereby the electrical characteristics of the HEMT are improved.

Furthermore, since AlGaAsPSb is employed for the electron supply layers 55 and 155, a thermally stable and highly reliable HEMT is realized, and the degree of freedom in design is increased. In addition, recombination of charge carriers at the heterointerface of the channel layer and the electron supply layer is suppressed, the carrier concentration of the channel layer is increased.

[Embodiment 8]

Figure 18:
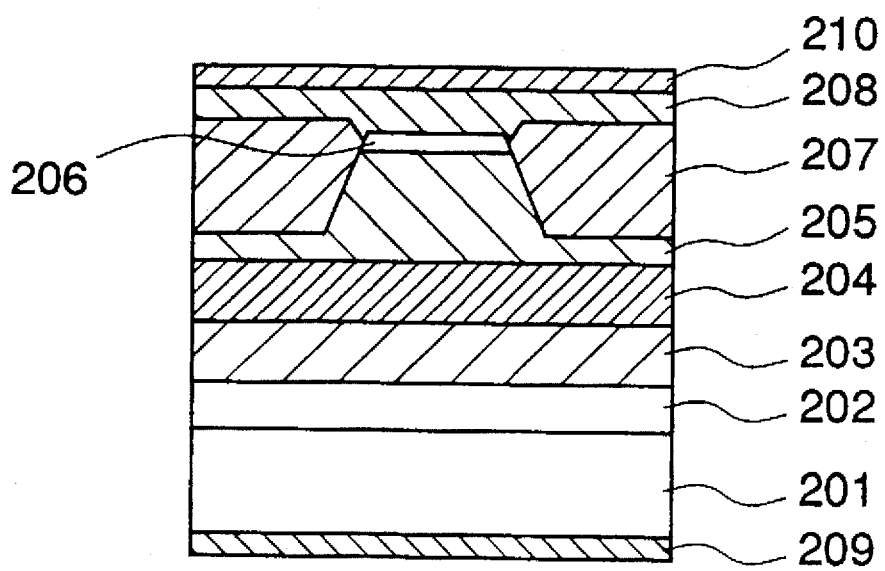
FIG. 18 is a cross-sectional view illustrating a semiconductor laser in accordance with an eighth embodiment of the present invention.

FIG. 18 is a cross-sectional view illustrating a semiconductor laser device including an active layer comprising InGaAs or InGaAsP and emitting laser light having a wavelength of 1.33 µm or 1.55 µm according to an eighth embodiment of the present invention. In this eighth embodiment, AlGaAsPSb is employed for upper and lower cladding layers of the semiconductor laser. In FIG. 18, reference numeral 201 designates an n type InP substrate. An n type InP buffer layer 202 having a thickness of 0.5 µm and a dopant concentration of $2\times10^{18}$ cm$^{-3}$ is disposed on the n type InP substrate 201. An n type $Al_{x5}Ga_{1-x5}As_{y5}P_{z5}Sb_{1-y5-z5}$ ($0\leq x5\leq 1$, $0\leq y5<1$, $0<z5\leq 1$) lower cladding layer 203 having a thickness of 1.5 µm and a dopant concentration of $1.5\times10^{18}$ cm$^{-3}$ is disposed on the buffer layer 202. An undoped InGaAs or InGaAsP active layer 204 having a thickness of 0.1 µm is disposed on the lower cladding layer 203. A p type $Al_{x6}Ga_{1-x6}As_{y6}P_{z6}Sb_{1-y6-z6}$ ($0\leq x6\leq 1$, $0\leq y6<1$, $0<z6\leq 1$) upper cladding layer 205 having a mesa structure is disposed on the active layer 204. The upper cladding layer 205 has a thickness of 1.5 µm and a dopant concentration of $1.5\times10^{18}$ cm$^{-3}$. A p type InGaAs cap layer 206 having a thickness of 0.05 µm and a dopant concentration of $1\times10^{19}$ cm$^{-3}$ is disposed on the upper cladding layer 205 at the top of the mesa structure. N type $Al_{x8}Ga_{1-x8}As_{y8}P_{z8}Sb_{1-y8-z8}$ ($0\leq x8\leq 1$, $0\leq y8<1$, $0<z8\leq 1$) current blocking layers 207 are disposed on the upper cladding layer 205, contacting both sides of the mesa structure. A p type GaAsSb contact layer 208 is disposed on the cap layer 206 and on the current blocking layers 207. An n side electrode 209 is disposed on the rear surface of the InP substrate 201 and makes an ohmic contact with the substrate 201. A p side electrode 210 is disposed on the contact layer 208 and makes an ohmic contact with the contact layer 208.

Figure 19:
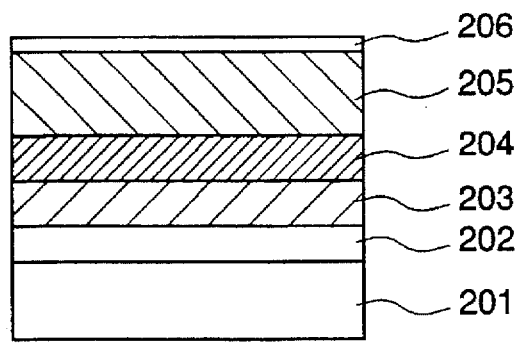
FIGS. 19(a)–19(d) are cross-sectional views illustrating process steps in a method of fabricating the semiconductor laser shown in FIG. 18.
Figure 19:
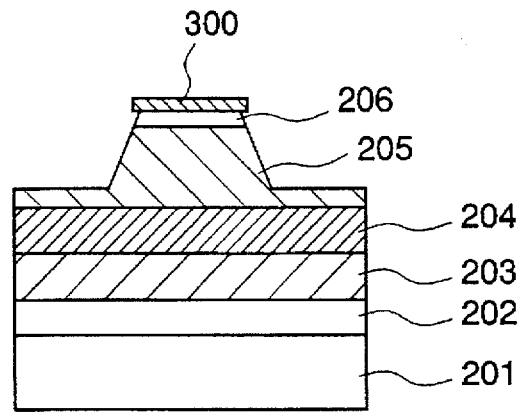
Figure 19:
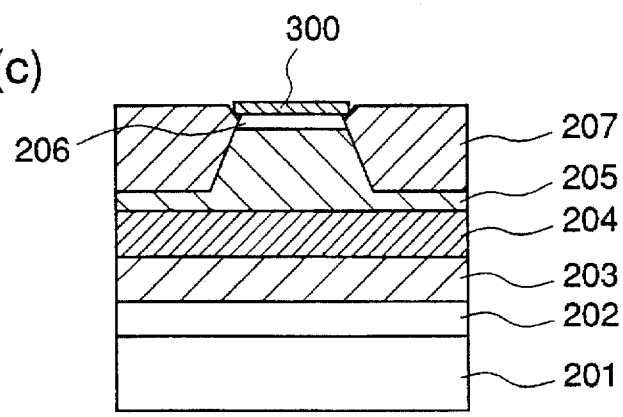
Figure 19:
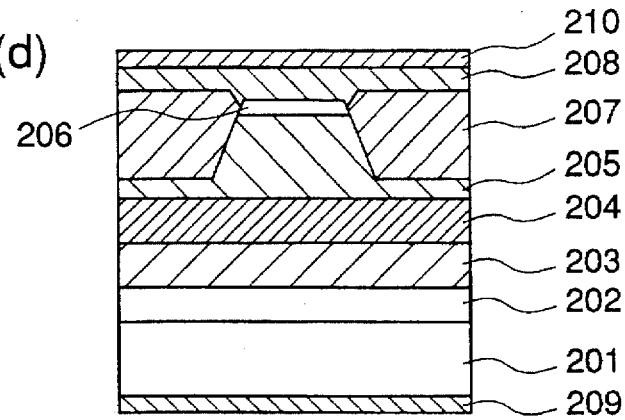

FIGS. 19(a)–19(d) are cross-sectional views illustrating process steps in a method of fabricating the semiconductor laser device shown in FIG. 18. Initially, as illustrated in FIG. 19(a), the n type InP buffer layer 202, the n type $Al_{x5}Ga_{1-x5}As_{y5}P_{z5}Sb_{1-y5-z5}$ lower cladding layer 203, the undoped InGaAs or InGaAsP active layer 204, the p type $Al_{x6}Ga_{1-x6}As_{y6}P_{z6}Sb_{1-y6-z6}$ upper cladding layer 205, and the p type InGaAs cap layer 206 are epitaxially grown on the n type InP substrate 201 in this order. Preferably, these layers are grown by MBE, MOMBE, gas source MBE, or MOCVD.

Thereafter, an SiN film is deposited over the entire surface of the cap layer 206, and a resist is formed on the SiN film by photolithographic techniques. Using the resist as a mask, the SiN film is etched to form a stripe-shaped SiN film 300. In the step of FIG. 19(b), using the SiN film 300 as a mask, the cap layer 206 is etched and, further, the upper cladding layer 205 is etched to a prescribed depth, forming a mesa structure. After removal of the resist, using the SiN film 300 as a mask, the AlGaAsPSb current blocking layer 207 is grown on the upper cladding layer 205, contacting both sides of the mesa structure. The current blocking layer 207 is grown by a selective epitaxial growth method using an insulating film as a mask, such as MOCVD.

After removal of the SiN film 300 by etching, as illustrated in FIG. 19(d), the p type GaAsSb contact layer 208 is grown over the entire surface, preferably by MOCVD. To complete the semiconductor laser shown in FIG. 18, the n side electrode 209 is formed on the rear surface of the n type InP substrate 201, and the p side electrode 210 is produced on the surface of the contact layer 208.

In this eighth embodiment of the invention, in the double heterojunction structure comprising the lower cladding layer 203, the active layer 204, and the upper cladding layer 205, the potential barriers of each heterojunction, in other words, the energy band discontinuity $\Delta Ec$ of the conduction band and the energy band discontinuity $\Delta Ev$ of the valence band, can be varied by varying the compositions of AlGaAsPSb constituting the lower cladding layer 203 and the upper cladding layer 205, whereby a semiconductor laser having a desired energy band structure is easily fabricated.

Furthermore, since AlGaAsPSb is employed for the cladding layers 203 and 205, a thermally stable and highly reliable semiconductor laser is realized, and the degree of freedom in design is improved.

[Embodiment 9]

Figure 20:
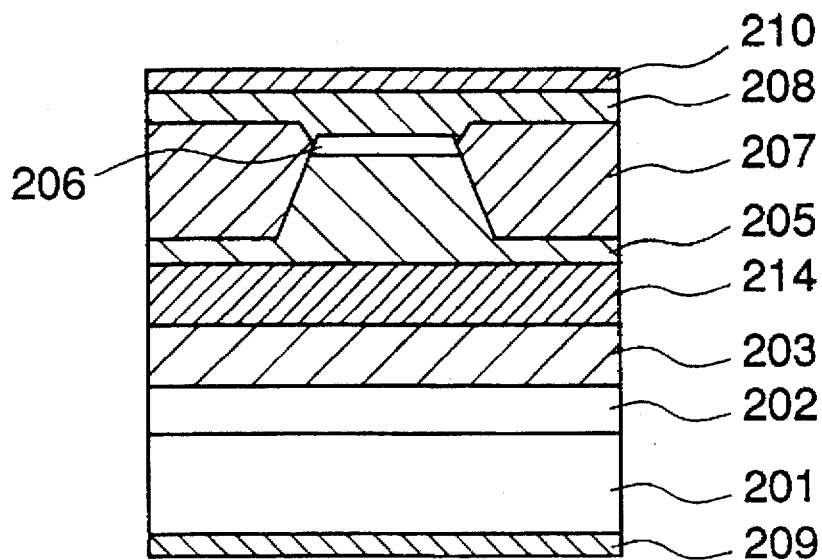
FIG. 20 is a cross-sectional view illustrating a semiconductor laser in accordance with a ninth embodiment of the invention.

FIG. 20 is a cross-sectional view illustrating a semiconductor laser employing AlGaAsPSb for an active layer and upper and lower cladding layers, in accordance with a ninth embodiment of the present invention. The semiconductor laser shown in FIG. 20 is identical to the semiconductor laser shown in FIG. 18 except that the active layer comprises AlGaAsPSb. In FIG. 20, reference numeral 214 designates an undoped or p type $Al_{x7}Ga_{1-x7}As_{y7}P_{z7}Sb_{1-y7-z7}$ ($0 \leq x7 \leq 1$, $0 \leq y7 < 1$, $0 < z7 \leq 1$) active layer. The composition of the AlGaAsPSb active layer 214 is selected so that the active layer is lattice-matched with the InP substrate 201 and has an energy band gap smaller than that of the upper and lower cladding layers 205 and 203. Preferably, the composition is selected so that the wavelength of the light produced by the laser is in a range from 0.6 μm to 2 μm.

Figure 21:
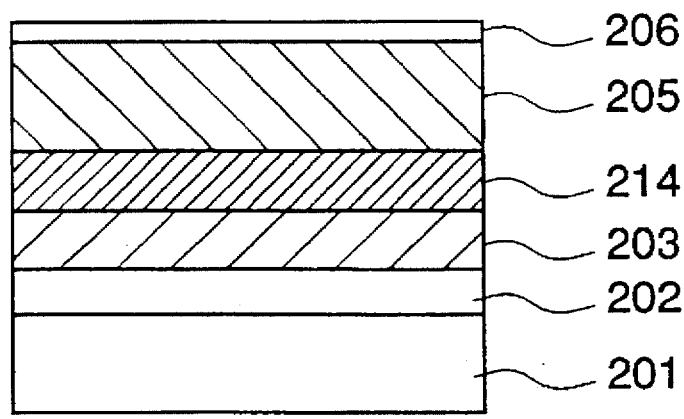
FIG. 21 is a cross-sectional view illustrating a process step in a method of fabricating the semiconductor laser shown in FIG. 20.

A description is given of the fabricating method. Initially, as illustrated in FIG. 21, the n type InP buffer layer 202, the n type $Al_{x5}Ga_{1-x5}As_{y5}P_{z5}Sb_{1-y5-z5}$ lower cladding layer 203, the undoped or p type $Al_{x7}Ga_{1-x7}As_{y7}P_{z7}Sb_{1-y7-z7}$ active layer 214, the p type $Al_{x6}Ga_{1-x6}As_{y6}P_{z6}Sb_{1-y6-z6}$ upper cladding layer 205, and the p type InGaAs cap layer 206 are epitaxially grown on the n type InP substrate 201 in this order. The process steps after the epitaxial growth are identical to those already described with respect to FIGS. 19(b)–19(d).

Figure 22:
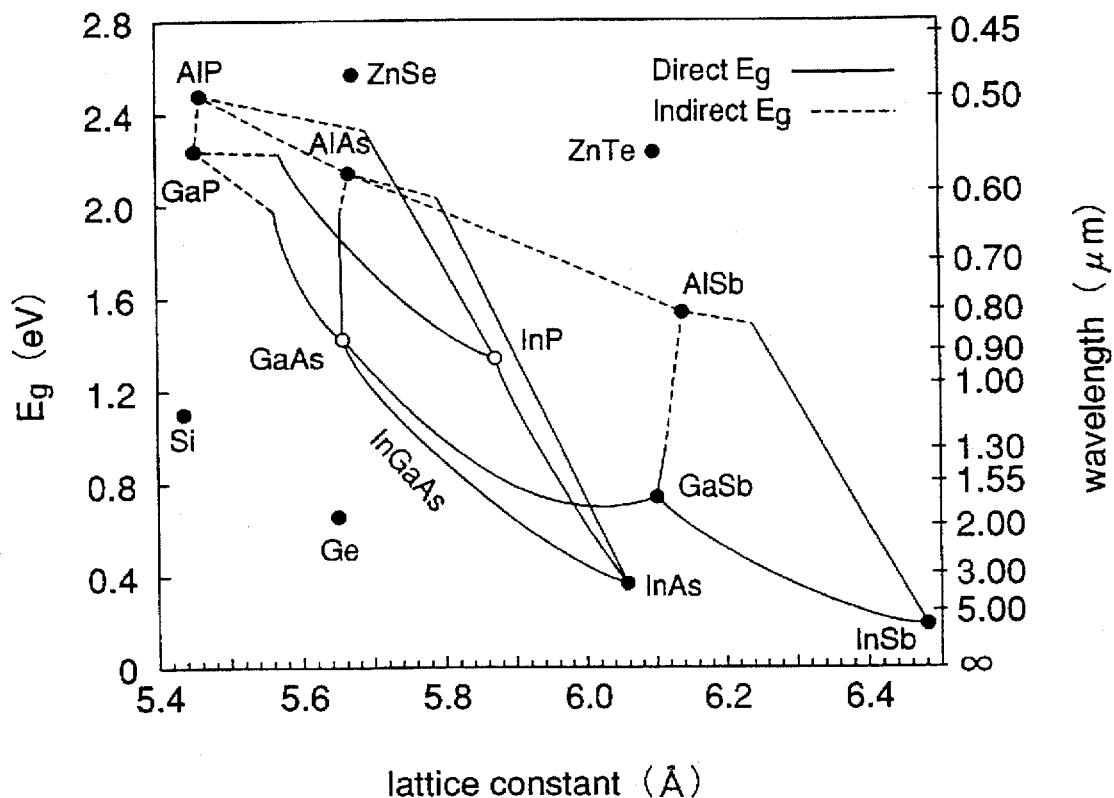
FIG. 22 is a diagram illustrating lattice constant vs. energy band gap vs. wavelength characteristics of compound semiconductors.
Figure 23:
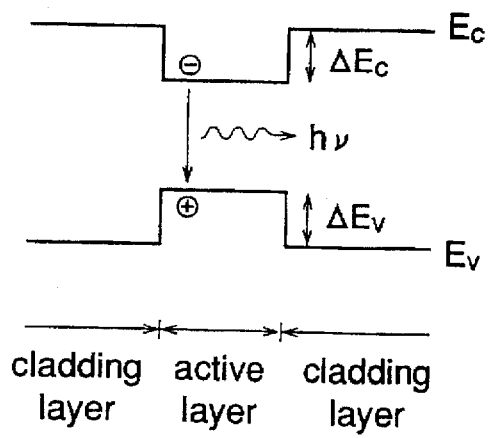
FIG. 23(a) is a diagram illustrating an energy band structure of a semiconductor laser including an AlGaAsPSb active layer.
FIG. 23(b) is a diagram illustrating an energy band structure of a semiconductor laser including an AlGaAsSb active layer.
Figure 23:
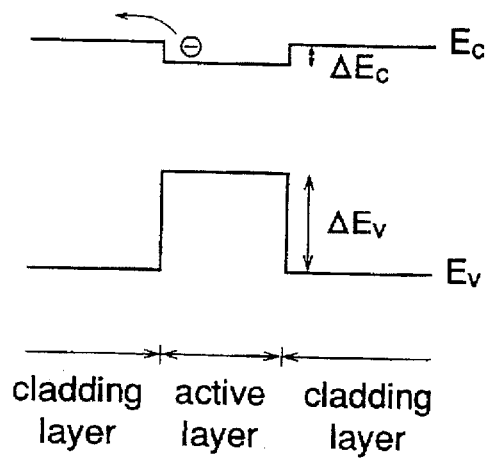

In this ninth embodiment, the active layer 214 comprises AlGaAsPSb. As shown in FIG. 22, the energy band gap Eg of AlGaAsPSb can be varied by changing the composition while maintaining the lattice constant, i.e., while lattice-matching with InP. Therefore, in the semiconductor laser shown in FIG. 9, by appropriately selecting the composition of the AlGaAsPSb active layer 214, the wavelength of the light produced by the laser can be varied in a wide range, from 0.6 μm to 2 μm, with the active layer being lattice-matched with the InP substrate. When the active layer comprises AlGaAsSb, the energy band discontinuity ΔEc in the active layer is decreased as shown in FIG. 23(b), and the electron confining effect is degraded, whereby the laser light emitting efficiency is reduced. In the semiconductor laser according to this ninth embodiment, however, since the AlGaAsPSb active layer 214 is employed, the energy band discontinuity ΔEc can be increased by increasing the P composition, whereby an energy band structure shown in FIG. 23(a) is realized. Therefore, unwanted degradation of the electron confining effect in the active layer is avoided, resulting in a semiconductor laser having a high light emitting efficiency.

Furthermore, since AlGaAsPSb is employed for the cladding layers 203 and 205 and the active layer 214, a thermally stable and highly reliable semiconductor laser is realized. In addition, the degree of freedom in design is improved.

[Embodiment 10]

Figure 24:
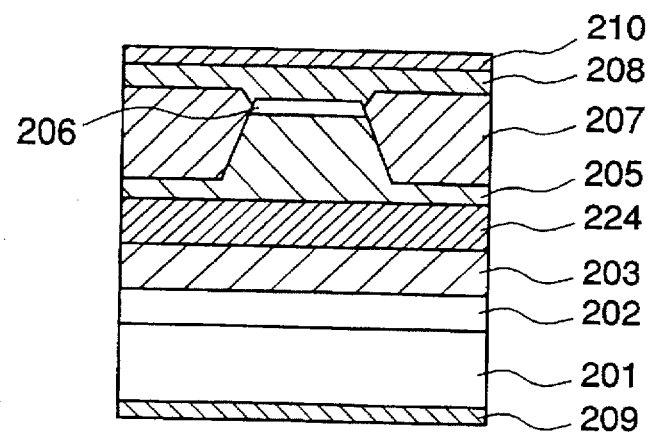
FIG. 24 is a cross-sectional view illustrating a semiconductor laser in accordance with a tenth embodiment of the present invention.

FIG. 24 is a cross-sectional view illustrating a semiconductor laser employing InGaAsSb for an active layer and AlGaAsPSb for upper and lower cladding layers, in accordance with a tenth embodiment of the present invention. The semiconductor laser shown in FIG. 24 is identical to the semiconductor laser shown in FIG. 18 except that the active layer comprises InGaAsSb. In FIG. 24, reference numeral 224 designates an undoped or p type InGaAsSb active layer. The composition of the InGaAsSb active layer 224 is selected so that the active layer is lattice-matched with the InP substrate 201 and has an energy band gap smaller than that of the upper and lower cladding layers 205 and 203. Preferably, the composition is selected so that the wavelength of the light produced by the laser is in a range from 2 μm to 4 μm.

Figure 25:
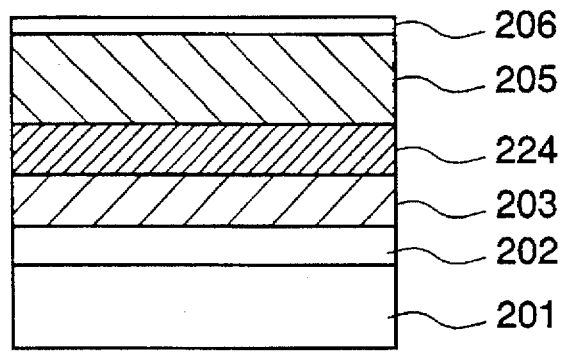
FIG. 25 is a cross-sectional view illustrating a process step of fabricating the semiconductor laser shown in FIG. 24.

A description is given of the fabricating method. Initially, as illustrated in FIG. 25, the n type InP buffer layer 202, the n type $Al_{x5}Ga_{1-x5}As_{y5}P_{z5}Sb_{1-y5-z5}$ lower cladding layer 203, the undoped or p type InGaAsSb active layer 224, the p type $Al_{x6}Ga_{1-x6}As_{y6}P_{z6}Sb_{1-y6-z6}$ upper cladding layer 205, and the p type InGaAs cap layer 206 are epitaxially grown on the n type InP substrate 201 in this order. The process steps after the epitaxial growth are identical to those already described with respect to FIGS. 19(b)–19(d).

In this tenth embodiment, since the active layer 224 comprises InGaAsSb, the wavelength of the light produced by the laser can be varied in a wide range from 2 μm to 4 μm.

Furthermore, since AlGaAsPSb is employed for the cladding layers 203 and 205, a thermally stable and highly reliable semiconductor laser is realized. In addition, the degree of freedom in design is improved.

[Embodiment 11]

Figure 26:
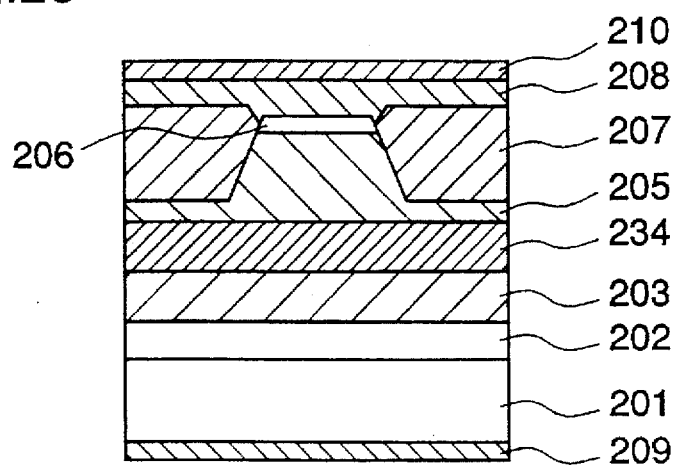
FIG. 26 is a cross-sectional view illustrating a semiconductor laser in accordance with an eleventh embodiment of the present invention.

FIG. 26 is a cross-sectional view illustrating a semiconductor laser employing InGaPSb for an active layer and AlGaAsPSb for upper and lower cladding layers, in accordance with an eleventh embodiment of the present invention. The semiconductor laser shown in FIG. 26 is identical to the semiconductor laser shown in FIG. 18 except that the active layer comprises InGaPSb. In FIG. 26, reference numeral 234 designates an undoped or p type InGaPSb active layer. The composition of the InGaPSb active layer 234 is selected so that the active layer is lattice-matched with the InP substrate 201 and has an energy band gap smaller than that of the upper and lower cladding layers 205 and 203. Preferably, the composition is selected so that the wavelength of the light produced by the laser is in a range from 2 μm to 4 μm.

Figure 27:
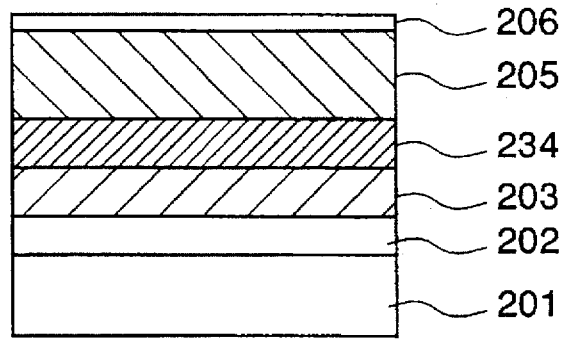
FIG. 27 is a cross-sectional view illustrating a process step of fabricating the semiconductor laser shown in FIG. 26.
Figure 28:
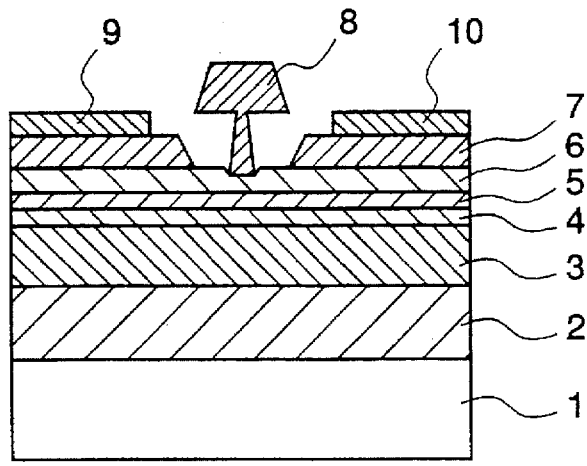
FIG. 28 is a cross-sectional view illustrating an HEMT according to the prior art.
Figure 29:
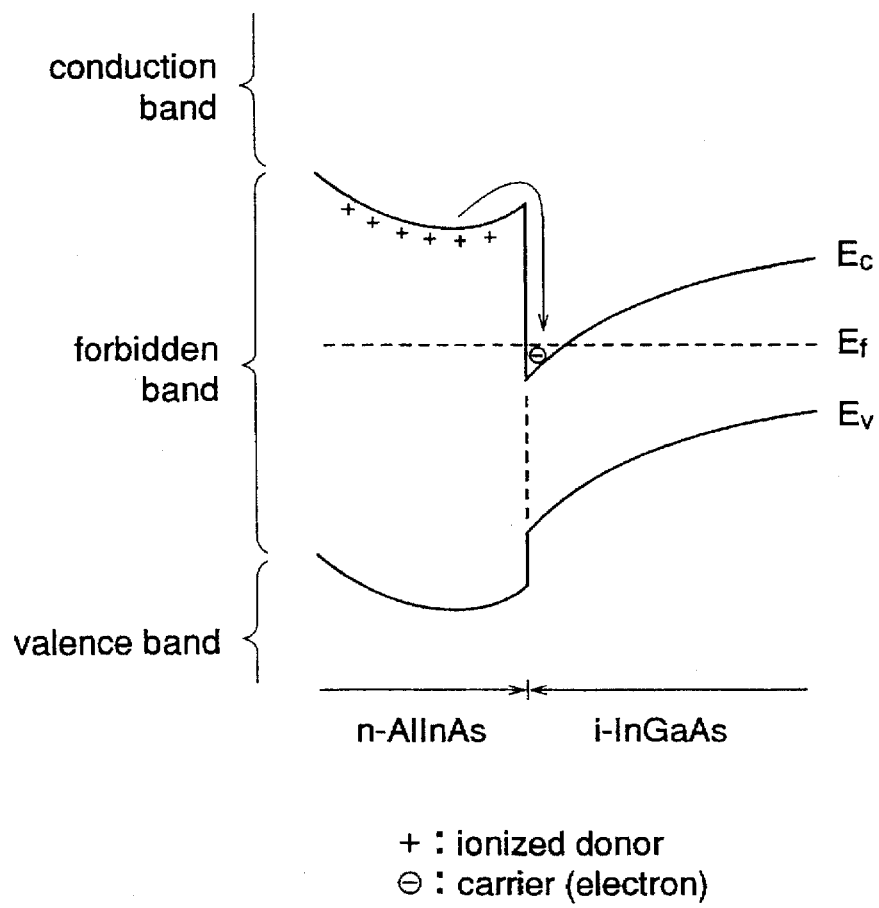
FIG. 29 is a diagram illustrating an energy band structure at a heterointerface between an n type AlInAs electron supply layer and an undoped InGaAs channel layer according to the prior art.

A description is given of the fabricating method. Initially, as illustrated in FIG. 27, the n type InP buffer layer 202, the n type $Al_{x5}Ga_{1-x5}As_{y5}P_{z5}Sb_{1-y5-z5}$ lower cladding layer 203, the undoped or p type InGaPSb active layer 234, the p type $Al_{x6}Ga_{1-x6}As_{y6}P_{z6}Sb_{1-y6-z6}$ upper cladding layer 205, and the p type InGaAs cap layer 206 are epitaxially grown on the n type InP substrate 201 in this order. The process steps after the epitaxial growth are identical to those already described with respect to FIGS. 19(b)–19(d).

In this eleventh embodiment, since the active layer 234 comprises InGaPSb, the wavelength of the light produced by the laser can be varied in a wide range, from 2 μm to 4 μm.

Furthermore, since AlGaAsPSb is employed for the cladding layers 203 and 205, a thermally stable and highly reliable semiconductor laser is realized. In addition, the degree of freedom in design is improved.

What is claimed is:

1. A semiconductor device including:
   a semiconductor substrate; and
   an $Al_xGa_{1-x}As_yP_zSb_{1-y-z}$ ($0 \leq x \leq 1$, $0 \leq y < 1$, $0 < z \leq 1$) layer disposed on the semiconductor substrate.

2. A semiconductor device including:
   an InP substrate having a lattice constant;
   a channel layer having an electron affinity, through which electrons, as charge carriers, travel; and
   an $Al_{x1}Ga_{1-x1}As_{y1}P_{z1}Sb_{1-y1-z1}$ ($0 \leq x1 \leq 1$, $0 \leq y1 < 1$, $0 < z1 \leq 1$) electron supply layer for supplying electrons to the channel layer, the electron supply layer having an electron affinity smaller than the electron affinity of the channel layer and being doped with a dopant impurity producing n type conductivity.

3. The semiconductor device of claim 2 including an undoped $Al_{x2}Ga_{1-x2}As_{y2}P_{z2}Sb_{1-y2-z2}$ ($0 \leq x2 \leq 1$, $0 \leq y2 < 1$, $0 < z2 \leq 1$) spacer layer disposed between the channel layer and the electron supply layer and having an electron affinity smaller than the electron affinity of the channel layer.

4. The semiconductor device of claim 2 including:

an undoped $Al_{x3}Ga_{1-x3}As_{y3}P_{z3}Sb_{1-y3-z3}$ ($0 \leq x3 \leq 1$, $0 \leq y3 < 1$, $0 < z3 \leq 1$) Schottky layer disposed on the opposite side of the channel layer from the substrate; and a gate electrode disposed on the Schottky layer.

5. The semiconductor device of claim 2 including:

an undoped $Al_{x4}Ga_{1-x4}As_{y4}P_{z4}Sb_{1-y4-z4}$ ($0 \leq x4 \leq 1$, $0 \leq y4 < 1$, $0 < z4 \leq 1$) buffer layer contacting the InP substrate and disposed between the channel layer and the substrate.

6. The semiconductor device of claim 2 wherein the electron supply layer includes a planar region containing a dopant impurity producing n type conductivity.

7. The semiconductor device of claim 2 wherein the electron supply layer includes a quantum well region comprising AlGaAsPSb and doped with a dopant impurity producing n type conductivity.

8. The semiconductor device of claim 2 wherein the electron supply layer is disposed on the opposite side of the channel layer from the substrate.

9. The semiconductor device of claim 2 wherein the electron supply layer is disposed between the channel layer and the InP substrate.

10. The semiconductor device of claim 2 including two electron supply layers respectively disposed on opposite sides of the channel layer.

11. The semiconductor device of claim 2 wherein the channel layer is a strained lattice layer comprising a semiconductor material having a lattice constant different from the lattice constant of the InP substrate.

12. A semiconductor laser device including:

an active layer emitting laser light and having a band gap energy; and an $Al_{x5}Ga_{1-x5}As_{y5}P_{z5}Sb_{1-y5-z5}$ ($0 \leq x5 \leq 1$, $0 \leq y5 < 1$, $0 < z5 \leq 1$) lower cladding layer having a first conductivity type and a band gap energy larger than the band gap energy of the active layer, and an $Al_{x6}Ga_{1-x6}As_{y6}P_{z6}Sb_{1-y6-z6}$ ($0 \leq x6 \leq 1$, $0 \leq y6 < 1$, $0 < z6 \leq 1$) upper cladding layer having a second conductivity type, opposite the first conductivity type, and a band gap energy larger than the band gap energy of the active layer, the lower and upper cladding layers sandwiching the active layer.

13. The semiconductor laser device of claim 12 wherein the active layer comprises $Al_{x7}Ga_{1-x7}As_{y7}P_{z7}Sb_{1-y7-z7}$ ($0 \leq x7 < 1$, $0 \leq y7 < 1$, $0 < z7 < 1$).

14. The semiconductor laser device of claim 12 wherein the active layer comprises InGaAsSb.

15. The semiconductor laser device of claim 12 wherein the active layer comprises InGaPSb.

* * * * *